(12) United States Patent  
Uno et al.

(10) Patent No.: US 9,236,321 B2  
(45) Date of Patent: Jan. 12, 2016

(54) SEMICONDUCTOR DEVICE AND MANUFACTURING METHOD THEREOF

(71) Applicant: RENESAS ELECTRONICS CORPORATION, Kawasaki-shi, Kanagawa (JP)

(72) Inventors: Tomoaki Uno, Kanagawa (JP); Tetsuya Kawashima, Nakagun Tokaimura Muramatsu (JP)

(73) Assignee: Renesas Electronics Corporation, Kanagawa (JP)

( * ) Notice: Subject to any disclaimer, the term of this patent is extended or adjusted under 35 U.S.C. 154(b) by 61 days.

(21) Appl. No.: 13/754,245

(22) Filed: Jan. 30, 2013

(65) Prior Publication Data

US 2013/0207256 A1    Aug. 15, 2013

(30) Foreign Application Priority Data

Feb. 15, 2012    (JP) .................................. 2012-030383

(51) Int. Cl.  
*H01L 23/48* (2006.01)  
*H01L 23/34* (2006.01)  
*H01L 21/50* (2006.01)  
*H01L 21/8234* (2006.01)  
(Continued)

(52) U.S. Cl.  
CPC .................. *H01L 23/34* (2013.01); *H01L 21/50* (2013.01); *H01L 21/823475* (2013.01); *H01L 24/34* (2013.01); *H01L 27/088* (2013.01); *H01L 2224/40247* (2013.01); *H01L 2224/45124* (2013.01); *H01L 2224/45144* (2013.01); *H01L 2224/45147* (2013.01); *H01L 2224/48091* (2013.01); *H01L 2224/48247* (2013.01); *H01L 2224/73221* (2013.01); *H01L 2924/01015* (2013.01); *H01L 2924/1306* (2013.01); *H01L 2924/13091* (2013.01); *H01L 2924/181* (2013.01); *H01L 2924/30107* (2013.01)

(58) Field of Classification Search  
USPC ........................... 257/735, 736, 773, 776, 784  
See application file for complete search history.

(56) References Cited

U.S. PATENT DOCUMENTS 5,455,440 A * 10/1995 Henderson et al. ........... 257/198  
5,814,884 A * 9/1998 Davis et al. .................... 257/723  
(Continued)

FOREIGN PATENT DOCUMENTS

JP          10233509 A       9/1998  
JP       2005-203584 A       7/2005  
(Continued)

OTHER PUBLICATIONS

Communication dated Apr. 23, 2015, issued by the Japan Patent Office in corresponding Japanese Application No. 2012-030383.

*Primary Examiner* — S. V. Clark  
(74) *Attorney, Agent, or Firm* — Sughrue Mion, PLLC

(57) ABSTRACT

A conventional semiconductor device used for a power supply circuit such as a DC/DC converter has problems of heat dissipation and downsizing, in particular has the problems of heat dissipation and others in the event of downsizing.

A semiconductor device has a structure formed by covering a principal surface of a semiconductor chip having the principal surface and a plurality of MIS type FETs formed over the principal surface with a plurality of metal plate wires having pectinate shapes; allocating the pectinate parts alternately in a planar view over the principal surface; and further electrically coupling the plural metal plate wires to a plurality of terminals.

18 Claims, 23 Drawing Sheets

(51) Int. Cl.
*H01L 27/088* (2006.01)
*H01L 23/00* (2006.01)

(56) References Cited

U.S. PATENT DOCUMENTS

| | | | |
|---|---|---|---|
| 5,945,730 A | 8/1999 | Sicard et al. | |
| 6,249,041 B1 * | 6/2001 | Kasem et al. | 257/666 |
| 6,448,645 B1 * | 9/2002 | Kimura et al. | 257/735 |
| 6,531,765 B2 * | 3/2003 | Kinsman | 257/676 |
| 7,145,224 B2 | 12/2006 | Kawashima et al. | |
| 7,622,796 B2 * | 11/2009 | Shi et al. | 257/678 |
| 8,203,380 B2 | 6/2012 | Hashimoto et al. | |
| 8,643,188 B2 * | 2/2014 | Stolze et al. | 257/773 |
| 8,816,411 B2 * | 8/2014 | Kajiwara et al. | 257/288 |
| 2005/0156204 A1 | 7/2005 | Uno et al. | |
| 2010/0127690 A1 | 5/2010 | Endo | |

FOREIGN PATENT DOCUMENTS

| | | |
|---|---|---|
| JP | 2005217072 A | 8/2005 |
| JP | 2010-016035 A | 1/2010 |
| JP | 2010129768 A | 6/2010 |
| JP | 201228529 A | 2/2012 |

\* cited by examiner

SEMICONDUCTOR DEVICE AND MANUFACTURING METHOD THEREOF

CROSS-REFERENCE TO RELATED APPLICATIONS

The disclosure of Japanese Patent Application No. 2012-030383 filed on Feb. 15, 2012 including the specification, drawings and abstract is incorporated herein by reference in its entirety.

BACKGROUND

The present invention relates to a semiconductor device, for example to a technology effectively applicable to a semiconductor device used for a power supply circuit.

A DC/DC converter widely used as a power supply circuit includes a high side switch, a low side switch, drivers (drive circuits) to drive the switches, a control circuit to control the drivers, etc. In each of the high side switch and the low side switch, a power MOSFET (Metal Oxide Semiconductor Field Effect Transistor) is used. Here, a high side switch is also called a control switch and a low side switch is also called a synchronous switch.

In a semiconductor device used for a power supply circuit such as a DC/DC converter, for example the following technologies are proposed with the aim of downsizing and reducing the inductance of a wire.

(1) Japanese Unexamined Patent Publication No. 2005-203584 (Patent Literature 1)

A power MOSFET for a high side switch, a drive circuit to drive the power MOSFET for the high side switch, and a drive circuit to drive a power MOSFET for a low side switch are formed in one semiconductor chip. A power MOSFET for the low side switch is formed in another chip. The two semiconductor chips are contained in one package.

(2) Japanese Unexamined Patent Publication No. 2010-16035 (Patent Literature 2)

A power MOSFET for a high side switch, a power MOSFET for a low side switch, and drivers and control circuits for them are formed over one semiconductor substrate.

PREVIOUS TECHNICAL LITERATURE

Patent Literature

[Patent Literature 1]
Japanese Unexamined Patent Publication No. 2005-203584
[Patent Literature 2]
Japanese Unexamined Patent Publication No. 2010-16035

SUMMARY

Patent Literature 1 describes the evaluations on the parameters of wire inductance, on resistance, downsizing, and heat dissipation in FIG. 13 of the patent publication with regard to the examples of the systems in FIGS. 8 to 12 of the patent publication. As is obvious from FIG. 13, the three cases in FIGS. 8, 10, and 12 of Patent Literature 1 have the problem of heat dissipation. Meanwhile, the case in FIG. 9 shows a moderate heat dissipation but has the problems of downsizing and the like. The case in FIG. 11 has the problem of downsizing.

Successively, Patent Literature 2 only describes how a power MOSFET for a high side switch, a power MOSFET for a low side switch, drivers for them, and others are allocated over one semiconductor substrate but does not take the problems of heat dissipation and others into consideration.

Other problems and novel features will be obvious from the descriptions and attached drawings in the present specification.

A semiconductor device according to an embodiment has a structure formed by covering a principal surface of a semiconductor chip having the principal surface and a plurality of MIS-type FETs formed over the principal surface with a plurality of metal plate wires having pectinate shapes and being allocated alternately in a planar view.

In the embodiment, it is possible to obtain a semiconductor device capable of downsizing and on top of that capable of improving heat dissipation.

BRIEF DESCRIPTION OF THE DRAWINGS

FIGS. 6A and 6B are views showing an external appearance of a semiconductor device shown in FIGS. 5A and 5B, in which FIG. 6A is a top view and FIG. 6B is a bottom view.

DETAILED DESCRIPTION

Embodiments are explained hereunder in detail in reference to drawings.

In the following embodiments, explanations are made in the manner of being divided into plural sections or embodiments for convenience when it is necessary. Unless otherwise specified however, they are not unrelated to each other and one is related to another as a modified example, an application, a detailed explanation, or a supplemental remark of a part or the whole thereof. Further, in the following embodiments, when the number of components or the like (including the number of pieces, a numerical value, a quantity, a range, etc.) is mentioned, the number is not particularly limited to the specific number and may be more or less than the specific number. Here, the case of being otherwise specified or obviously limited to the specific number in principle is excluded.

Furthermore, in the following embodiments, constituent components (including component steps) are not always essential unless otherwise specified or considered to be essential in principle. Similarly, in the following embodiments, when a shape, positional relationship, etc. of a constituent component or the like are mentioned, a shape or the like which is substantially close or similar to the shape is included. Here, the case of being otherwise specified or considered to be otherwise in principle is excluded. The same goes for a number or the like (including the number of pieces, a numerical value, a quantity, a range, etc.) stated above.

Here, in all the drawings for explaining the embodiments, members having an identical function are represented with an identical or related code and repetitive explanations are omitted. In the following embodiments, explanations on identical or similar components are not repeated in principle except when particularly necessary.

Embodiment 1

Figure 1A:
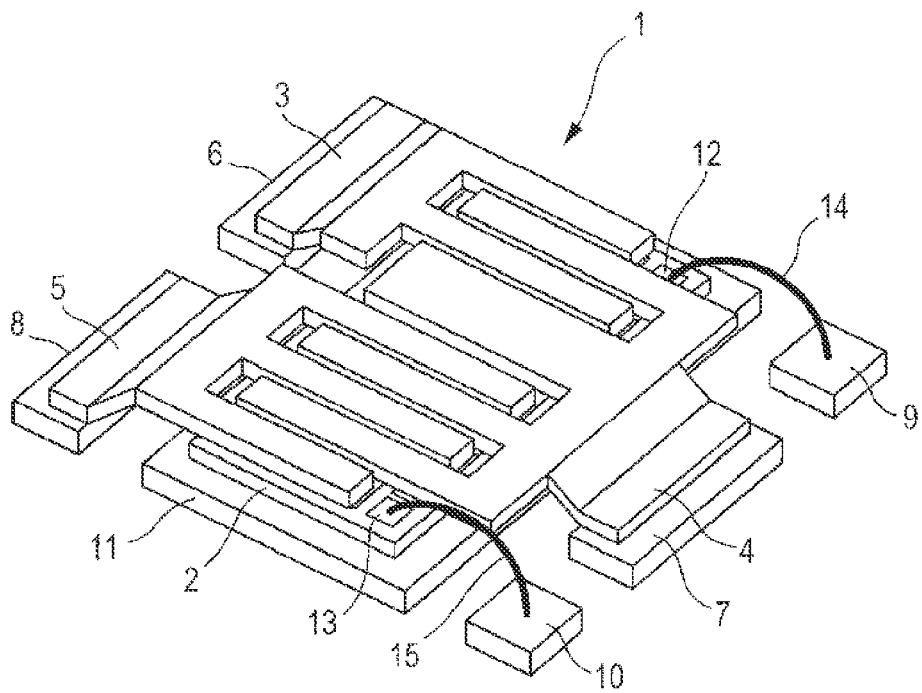
FIGS. 1A and 1B are perspective views showing a semiconductor device according to Embodiment 1.
Figure 1B:
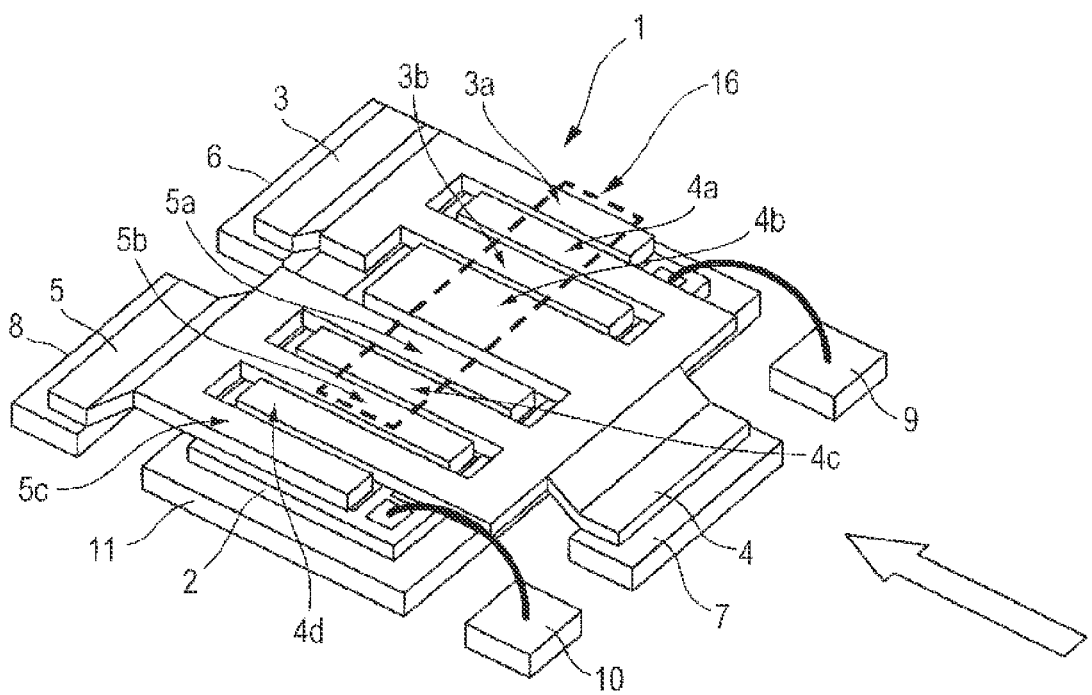

FIG. 1A is a perspective view showing a semiconductor device according to Embodiment 1 and FIG. 1B is a perspective view of a semiconductor device showing the part described in FIGS. 2A and 2B that will be explained later with the broken line. Here, FIGS. 1A and 1B are the views showing a semiconductor device in the state of removing an encapsulation resin.

As is shown in FIGS. 1A and 1B, a semiconductor device 1 includes a semiconductor chip 2, a first metal plate wire 3, a second metal plate wire 4, a third metal plate wire 5, an input terminal 6, an output terminal 7, a ground terminal 8, a first gate terminal 9, a second gate terminal 10, a heat sink 11, and bonding wires 14 and 15. The semiconductor chip 2 has a first gate electrode pad (high side gate electrode pad) 12 and a second gate electrode pad (low side gate electrode pad) 13.

The pectinate first metal plate wire 3, the pectinate second metal plate wire 4, and the pectinate third metal plate wire 5 are formed so as to extend from the outside of the semiconductor chip 2 over a principal surface of the semiconductor chip 2, respectively. The first metal plate wire 3 has pectinate parts 3a and 3b, the second metal plate wire 4 has pectinate parts 4a, 4b, 4c, and 4d, and the third metal plate wire 5 has pectinate parts 5a, 5b, and 5c, respectively.

The respective pectinate parts of the first metal plate wire 3, the second metal plate wire 4, and the third metal plate wire 5 are alternately allocated in a planar view so as to cover the principal surface of the semiconductor chip 2. Further, the part of the first metal plate wire 3 located outside the semiconductor chip 2 is electrically coupled to the input terminal 6. The part of the second metal plate wire 4 located outside the semiconductor chip 2 is electrically coupled to the output terminal 7. The part of the third metal plate wire 5 located outside the semiconductor chip 2 is electrically coupled to the ground terminal 8. The input terminal 6, the output terminal 7, and the ground terminal 8 are allocated outside the semiconductor chip 2, respectively.

Further, the first gate electrode pad 12 is coupled to the first gate terminal (high side gate terminal) 9 located outside the semiconductor chip 2 through the bonding wire 14. The second gate electrode pad 13 is also coupled to the second gate terminal (low side gate terminal) 10 located outside the semiconductor chip 2 through the bonding wire 15.

Furthermore, a frame including a solid plate used as the heat sink 11 is coupled to the other principal surface (rear surface of the semiconductor chip 2) on the other side of the principal surface of the semiconductor chip 2.

The first metal plate wire 3, the second metal plate wire 4, the third metal plate wire 5, the heat sink 11, the input terminal 6, the output terminal 7, and the ground terminal 8 are formed by pressing or etching a copper (Cu) plate for example.

As the bonding wires 14 and 15, gold wires are used but aluminum wires or copper wires may also be used.

The semiconductor chip 2 has a rectangular shape in a planar view but may also have a square shape. That is, any shape is acceptable as long as the shape has four sides in a planar view.

Figure 2A:
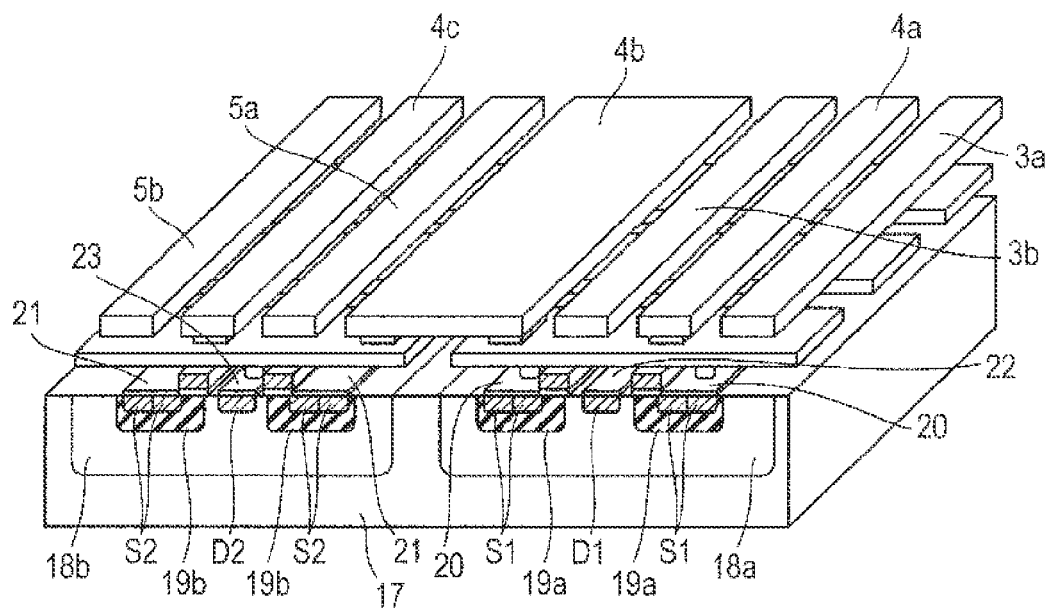
FIGS. 2A and 2B are sectional perspective views of a semiconductor device according to Embodiment 1.

FIG. 2A is a sectional perspective view of the part shown with the broken line in FIG. 1B in the semiconductor device 1 viewed from the direction shown with the solid-white arrow. FIG. 2B is a sectional perspective view showing the state (semiconductor chip 2) of removing the pectinate parts 3a, 3b, 4a, 4b, 4c, 5a, and 5b of the metal plate wires in the semiconductor device 1 shown in FIG. 2A. Here, the heat sink 11 shown in FIGS. 1A and 1B is omitted in FIGS. 2A and 2B.

Figure 2B:
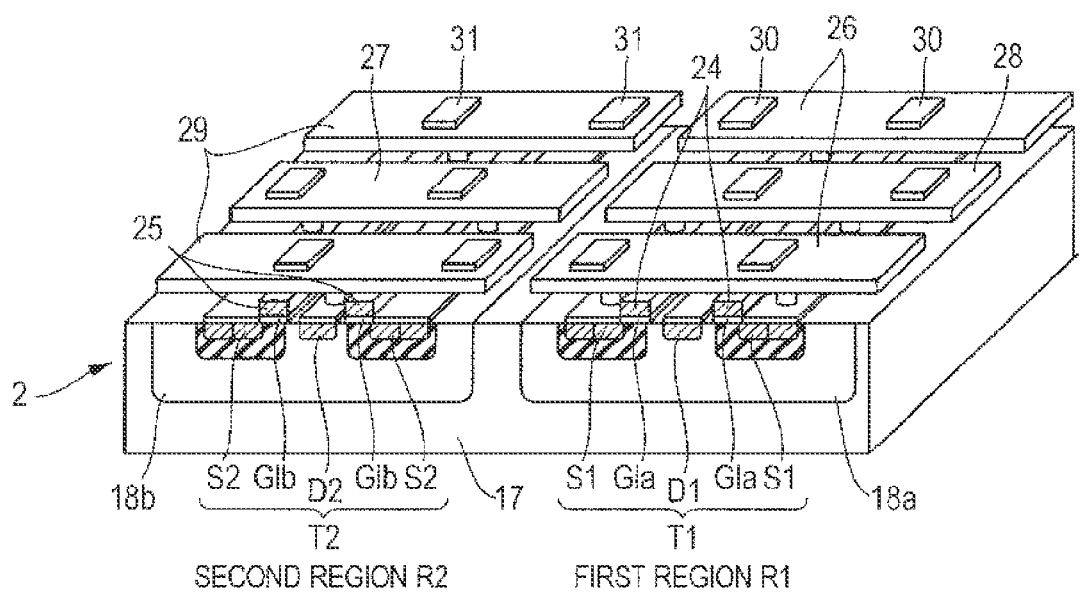

As is shown in FIG. 2B, a high side (control) switch T1 and a low side (synchronous) switch T2 are formed with power MISFETs (Metal Insulator Semiconductor Field Effect Transistors) respectively in the semiconductor chip 2. The power MISFET constituting the high side switch T1 has source electrodes 20, a drain electrode 22, and gate electrodes 24 over the top face side (identical face side) of the semiconductor chip. The power MISFET constituting the low side switch T2 has source electrodes 21, a drain electrode 23, and gate electrodes 25 over the top face side (identical face side) of the semiconductor chip. Such a power MISFET is also called a horizontal power MISFET. Although FIGS. 2A and 2B show the case where both the high side switch T1 and the low side switch T2 are n-channel type power MISFETs, the case where the high side switch T1 is a p-channel type power MISFET and the low side switch T2 is an n-channel type power MISFET is also acceptable.

A MISFET may also be a MOS (Metal Oxide Semiconductor) type FET. As the gate electrodes of a MISFET or a MOSFET, any material can be used as long as the material is a conductor such as polysilicon and the material is not necessarily a metal.

The high side (control) switch is also called a high side MISFET or a high side MIS type FET, and the low side (synchronous) switch is also called a low side MISFET or a low side MIS type FET.

As is obvious from FIGS. 2A and 2B, the high side switch T1 and the low side switch T2 formed in the semiconductor chip 2 are covered with the respective pectinate parts 3a, 3b, 4a, 4b, 4c, 5a, and 5b of the first, second, and third metal plate wires 3, 4, and 5. The pectinate parts 4d and 5c shown in FIGS. 1A and 1B are not shown in the figures.

The pectinate parts 3a, 3b, 4a, 4b, 4c, 5a, and 5b are coupled to the high side switch T1 and the low side switch T2 through source pads 26 and 27 and drain pads 28 and 29.

Each of the first, second, and third metal plate wires 3, 4, and 5 having the pectinate parts 3a, 3b, 4a, 4b, 4c, 5a, and 5b preferably has a width (transverse direction in the section) of 0.3 mm or more for example and a thickness (vertical direction in the section) of 50 μm or more for example in the sections of FIGS. 2A and 2B.

As is obvious from FIGS. 2A and 2B, the source pads 26 and the drain pad 28 are formed over the source electrodes 20, the drain electrode 22, and the gate electrodes 24. The source pad 27 and the drain pads 29 are formed over the source electrodes 21, the drain electrode 23, and the gate electrodes 25. Then a plurality of solder bumps 30 for being coupled to the pectinate parts 3a, 3b, 4a, and 4b are formed over the source pads 26 and the drain pad 28. Further, a plurality of solder bumps 31 for being coupled to the pectinate parts 4b, 4c, 5a, and 5b are formed over the source pad 27 and the drain pads 29.

The source pads 26 and 27 and the drain pads 28 and 29 in the semiconductor chip 2 are located under the first, second, and third metal plate wires 3, 4, and 5 so as to extend in the direction crossing the first, second, and third metal plate wires 3, 4, and 5. The source pads 26 and 27 and the drain pads 28 and 29 include aluminum (Al) for example but may also include copper (Cu).

Further, the solder bumps 30 and 31 may be gold (Au) balls or copper (Cu) balls.

Figure 3:
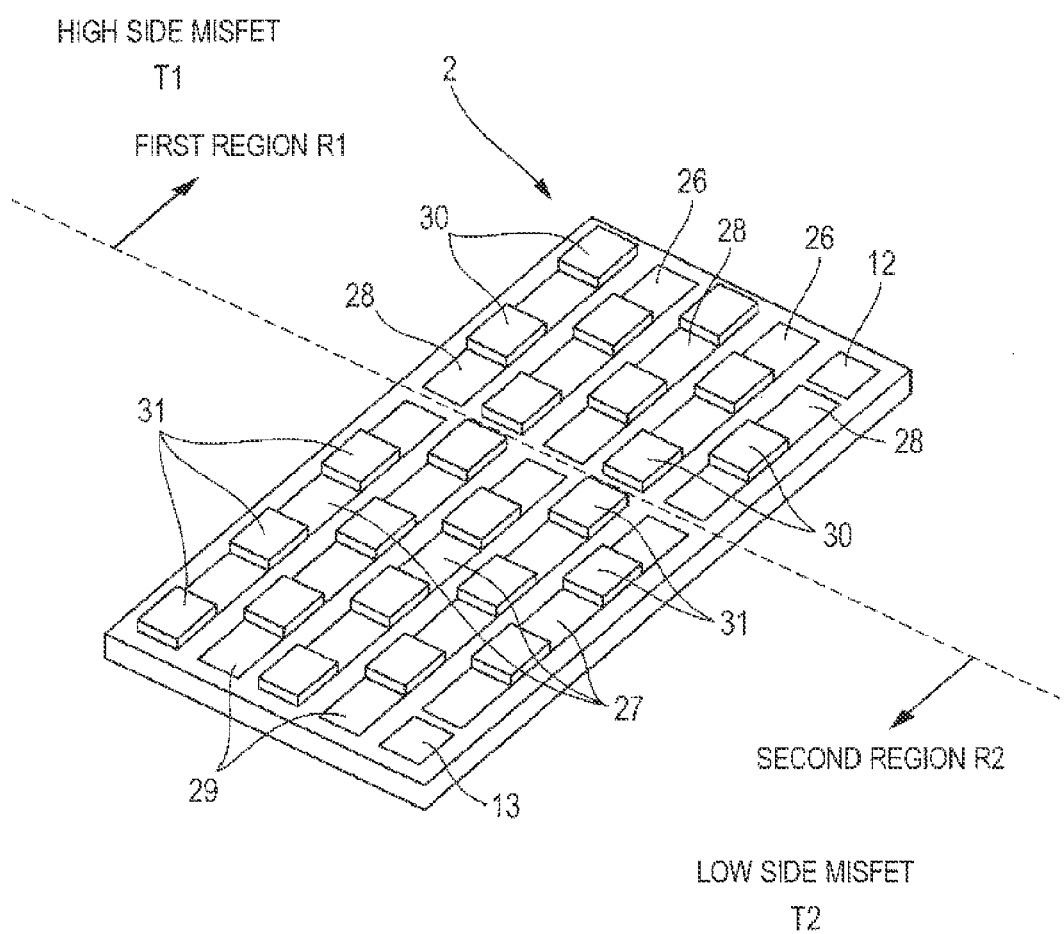
FIG. 3 is a perspective view of a semiconductor chip according to Embodiment 1.

Each of the source pads 26 and 27 and the drain pads 28 and 29 has a width (depth direction in the section) of 0.1 to 0.4 mm for example and a thickness (vertical direction in the section) of 1 to 10 μm for example in the section of FIG. 3.

Further, source regions S1 and a drain region D1 of the high side switch T1 are formed in an N$^-$-type well region 18a and source regions S2 and a drain region D2 of the low side switch T2 are formed in an N$^-$-type well region 18b, respectively.

Then the source regions S1 of the high side switch T1 are formed in P$^-$-type well regions 19a formed in the N$^-$-type well region 18a and the source regions S2 of the low side switch T2 are formed in P$^-$-type well regions 19b formed in the N$^-$-type well region 18b, respectively.

Then the source electrodes 20 are formed over the source regions S1 and the source electrodes 21 are formed over the source regions S2, respectively. Further, the drain electrode 22 is formed over the drain region D1 and the drain electrode 23 is formed over the drain region D2, respectively. Each of the source electrodes 20 and 21 and the drain electrodes 22 and 23 has a width (transverse direction in the section) of 1 to 2 μm for example and a thickness (vertical direction in the section) of 0.1 to 1 μm for example in the sectional perspective views of FIGS. 2A and 2B.

Further, the gate electrodes 24 are formed between the source regions S1 and the drain region D1 over the semiconductor substrate through gate insulation films GIa. Likewise, the gate electrodes 25 are formed between the source regions S2 and the drain region D2 over the semiconductor substrate through gate insulation films GIb. Each of the gate electrodes 24 and 25 has a width of 0.5 to 2 μm for example and a thickness of 0.1 to 0.5 μm for example in the sections of FIGS. 2A and 2B. Each of the gate insulation films GIa and GIb has a width of 0.5 to 2 μm for example and a thickness of 5 to 100 nm for example.

As is obvious from FIGS. 2A and 2B, the pectinate part 4b of the second metal plate wire 4 is coupled to the source pads 26 and the drain pads 29 through the solder bumps 30 and 31. That is, the source electrodes S1 of the high side switch T1 and the drain electrode D2 of the low side switch T2 formed in the semiconductor chip 2 are coupled to each other with the metal plate wire 4b of a single plate through the source pads 26, the drain pads 29, and the solder bumps 30 and 31.

A region of the principal surface of the semiconductor chip 2 where the high side switch T1 is formed is defined as a first region R1 and a region of the principal surface of the semiconductor chip 2 where the low side switch T2 is formed is defined as a second region R2, respectively.

FIG. 3 is a perspective view of the semiconductor chip 2 in the state of removing the metal plate wires, the input terminal, the output terminal, the ground terminal, the gate terminals, the heat sink, and the bonding wires of the semiconductor device 1 in FIGS. 1A and 1B.

As is shown in FIG. 3, the high side switch T1 is formed in the first region R1 of the principal surface of the semiconductor chip 2 and the low side switch T2 is formed in the second region R2 of the principal surface of the semiconductor chip 2. Then the source pads 26 and the drain pads 28 are allocated alternately over the first region R1 and the source pads 27 and the drain pads 29 are allocated alternately over the second region R2.

Further, the first gate electrode pad 12 is formed in the vicinity of the upper right corner of the first region R1 and the second gate electrode pad 13 is formed in the vicinity of the lower right corner of the second region R2, respectively.

The semiconductor chip 2 is a 2 in 1 chip wherein two switches (MISFETs) are formed in one semiconductor chip.

Figure 4A:
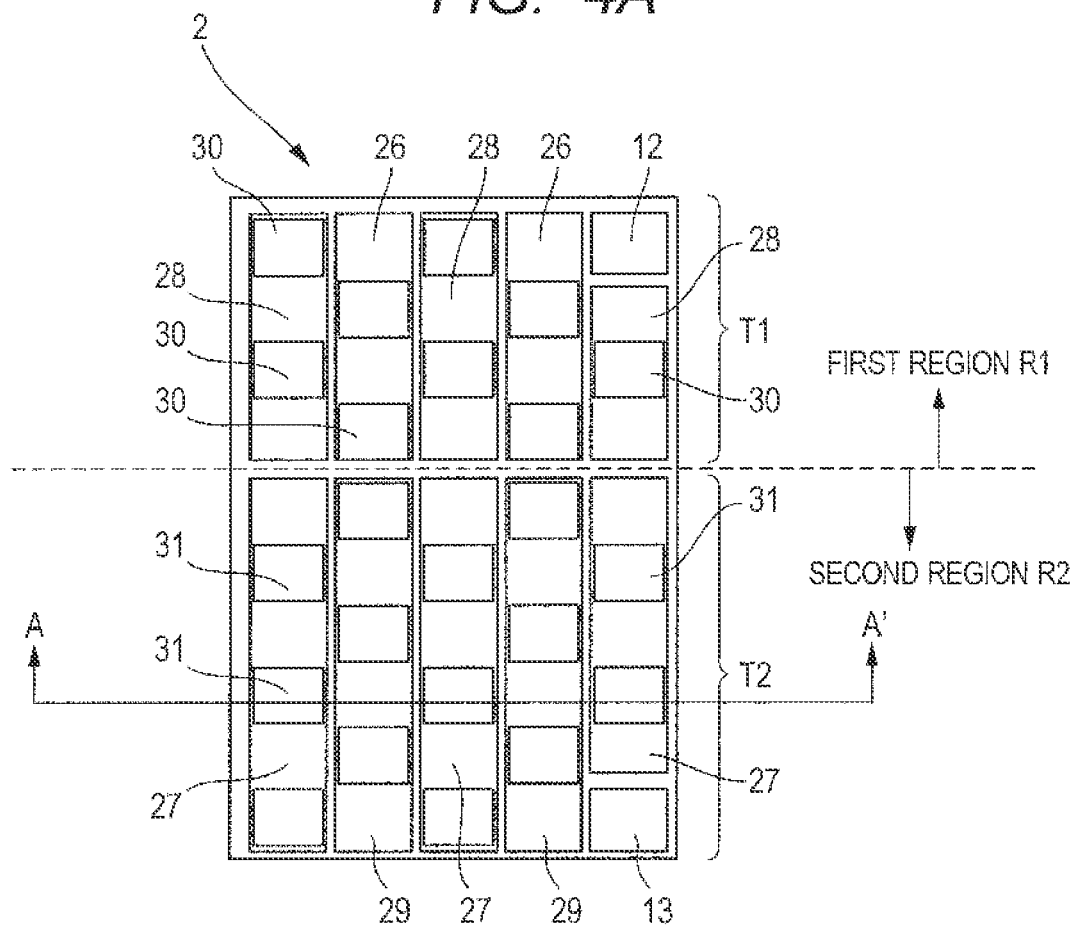
FIG. 4A is a plan view of the surface of a semiconductor chip shown in FIG. 3 viewed from above and FIG. 4B is a sectional view thereof.
Figure 4B:
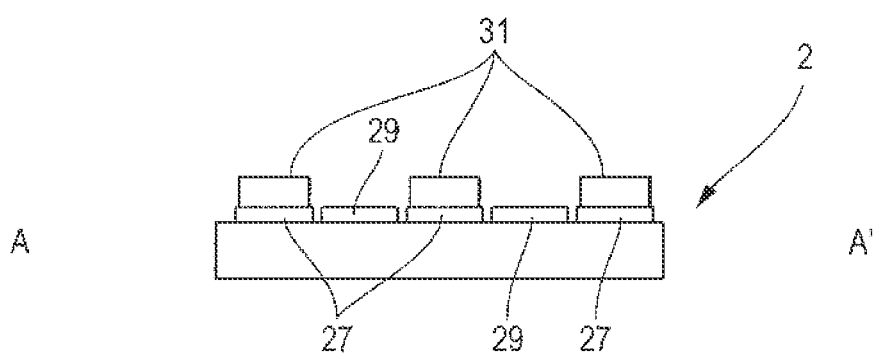

FIG. 4A is a plan view of the surface of a semiconductor chip shown in FIG. 3 viewed from above and FIG. 4B is a sectional view taken on line A-A' in FIG. 4A.

As is obvious from FIGS. 4A and 4B, the high side switch T1 is formed in the first region of the semiconductor chip 2 having a quadrangular shape in a planar view and the low side switch T2 is formed in the second region of the semiconductor chip 2, respectively. As is shown in FIG. 3, the source pads 26 and the drain pads 28 are allocated alternately over the first region R1 and the source pads 27 and the drain pads 29 are allocated alternately over the second region R2.

Further, as is shown in FIGS. 4A and 4B, the source pads 26 and 27 and the drain pads 28 and 29 have strip-shapes or rectangular shapes in a planar view.

Further, the source pads 26 and 27 and the drain pads 28 and 29 are allocated so as to be located on identical lines. That is, one of the source pads 26 over the first region R1 and the relevant one of the drain pads 29 over the second region R2 are allocated so as to be located on an identical line over the principal surface of the semiconductor chip 2 in a planar view. Then one of the drain pads 28 over the first region R1 and the relevant one of the source pads 27 over the second region R2 are also allocated so as to be located on an identical line over the principal surface of the semiconductor chip 2 in a planar view.

As is shown in FIG. 3, the first gate electrode pad 12 is formed in the vicinity of the upper right corner of the first region R1 and the second gate electrode pad 13 is formed in the vicinity of the lower right corner of the second region R2 respectively over the principal surface of the semiconductor chip 2.

Successively, as is shown in FIG. 4B, in the second region R2, the plural solder bumps 31 are formed over the source pads 27 and the drain pads 29 allocated alternately. Likewise, in the first region R1, the plural solder bumps 30 are formed over the source pads 26 and the drain pads 28 allocated alternately.

In the semiconductor device 1 and the semiconductor chip 2 described in FIGS. 1A to 4B, a first interlayer insulation film 49 formed under the source pads 26 and 27 and the drain pads 28 and 29 and a second interlayer insulation film 50 formed over the source pads 26 and 27 and the drain pads 28 and 29 are omitted.

Figure 5A:
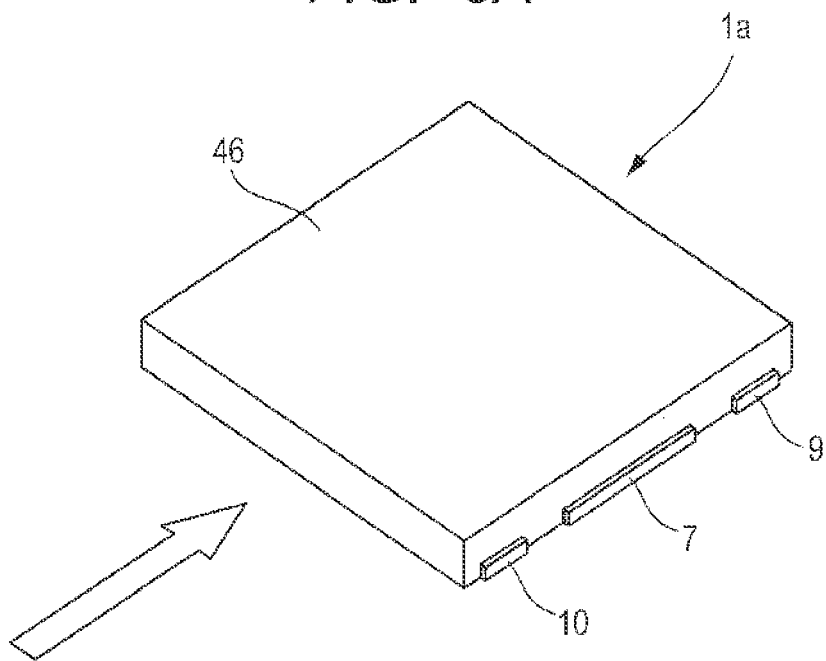
FIGS. 5A and 5B are views showing an external appearance in the case of sealing a semiconductor device shown in FIG. 1 with resin.
Figure 5B:
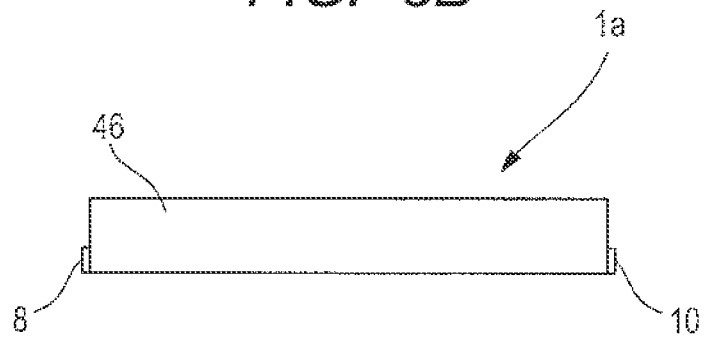
Figure 6A:
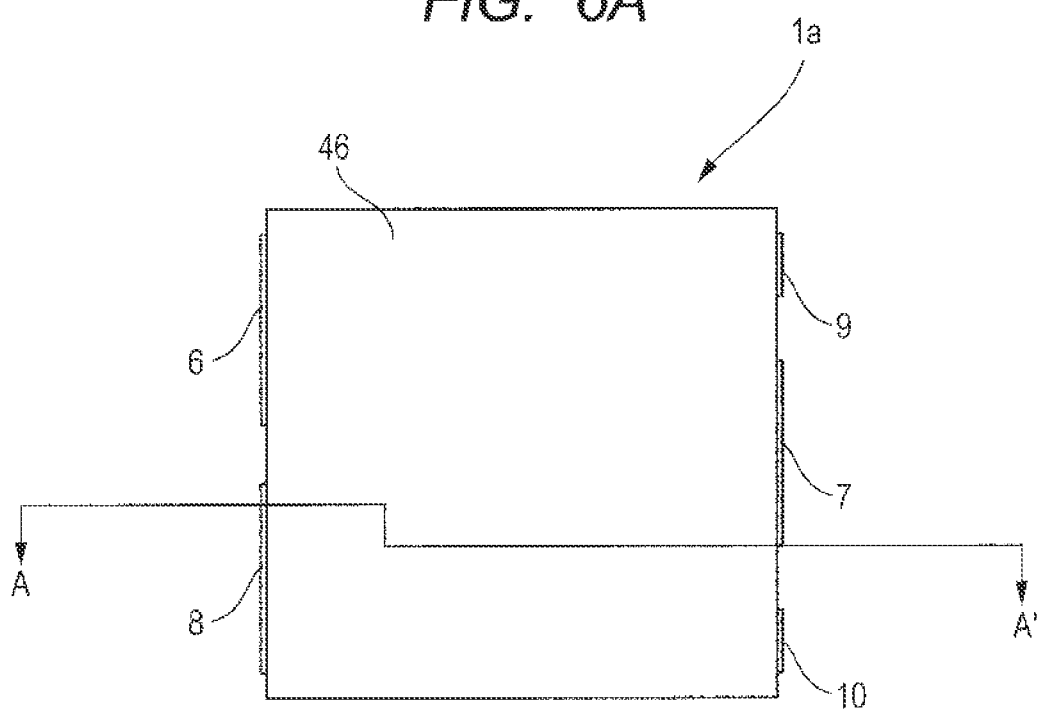
Figure 6B:
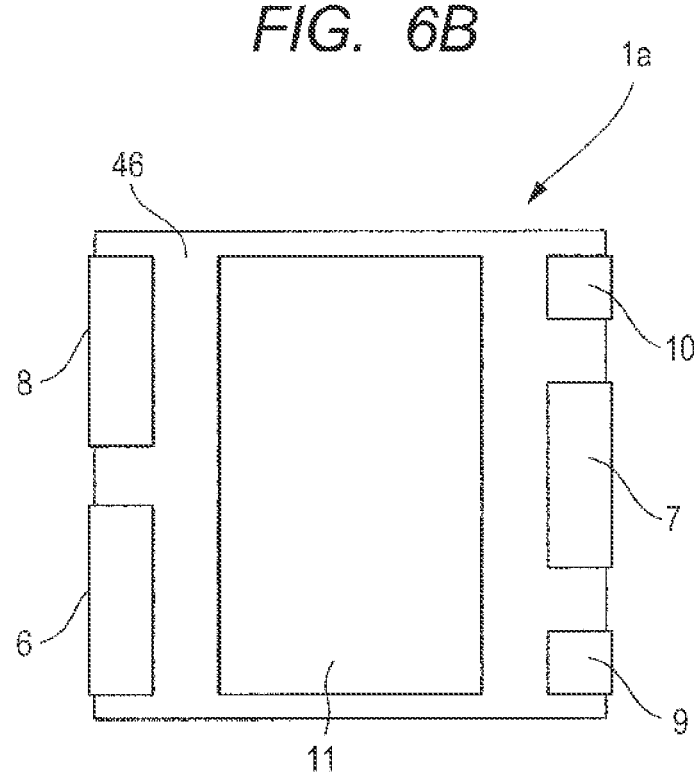
Figure 7:
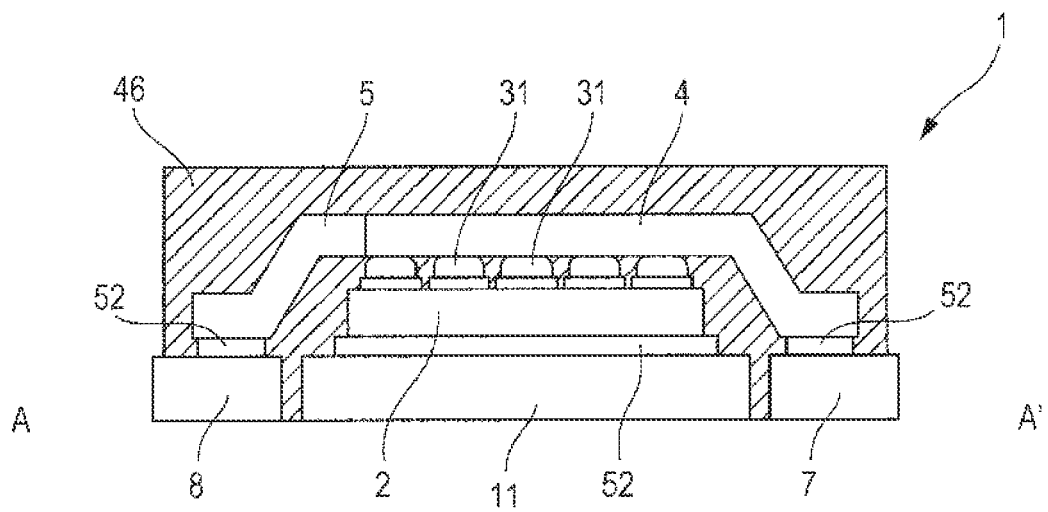
FIG. 7 is a sectional view of a semiconductor device taken on line A-A' of FIG. 6A.

FIGS. 5A and 5B are views showing an external appearance in the case of sealing the semiconductor device 1 with resin, in which FIG. 5A is a perspective view viewed obliquely from above and FIG. 5B is a side view viewed from the direction indicated with the solid-white arrow shown in FIG. 5A. FIGS. 6A and 6B are views showing an external appearance of a semiconductor device 1a, in which FIG. 6A is a top view and FIG. 6B is a bottom view. FIG. 7 is a sectional view of the semiconductor device 1a taken on line A-A' in FIG. 6A. The first and second interlayer insulation films 49 and 50 are also omitted in the sectional view.

As is shown in FIGS. 5A to 7, in the semiconductor device 1a formed by sealing the semiconductor device 1 with an encapsulation resin 46, the respective parts of the input terminal 6, the output terminal 7, the ground terminal 8, the first gate terminal 9, and the second gate terminal 10 are exposed over the side face of the encapsulation resin 46.

Further, as is shown in FIG. 6B, the respective parts of the heat sink 11, the input terminal 6, the output terminal 7, the ground terminal 8, the first gate terminal 9, and the second gate terminal 10 are exposed over the bottom face of the encapsulation resin 46.

Furthermore, as is obvious from the sectional view of FIG. 7, the semiconductor chip 2 is coupled to the heat sink 11 through an adhesive 52 having a good heat dissipation and the parts of the second metal plate wire 4 and the third metal plate wire 5 located outside the semiconductor chip 2 are coupled to the output terminal 7 and the ground terminal 8 through the adhesive 52 having a good heat dissipation, respectively. The parts of the second metal plate wire 4 and the third metal plate wire 5 located over the semiconductor chip 2 are coupled to the semiconductor chip 2 through the solder bumps 31.

Although the external appearances of the top face, the bottom face, and the side faces of the encapsulation resin 46 in the semiconductor device 1a are quadrangles, each of the faces may have a chamfered external appearance. In this case therefore, the right and left upper corners of the encapsulation resin 46 have chamfered shapes in the sectional view of FIG. 7.

Figure 8:
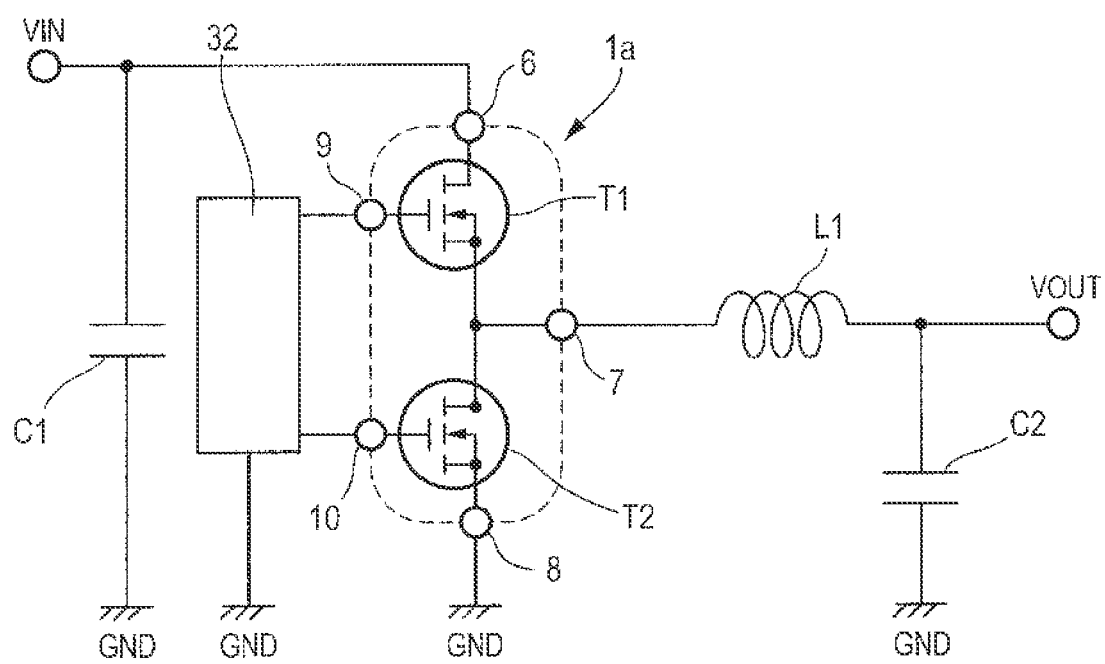
FIG. 8 is an equivalent circuit schematic in the case of using a semiconductor device shown in FIGS. 1A to 7 for a DC/DC converter.

Successively, FIG. 8 is an equivalent circuit schematic in the case of using the semiconductor device 1a for a DC/DC converter.

As is obvious from FIG. 8, the input terminal 6 of the semiconductor device 1 is coupled to an input voltage terminal VIN and also to an electrode of a condenser C1. The other electrode of the condenser C1 is coupled to a ground terminal GND. Then a choke coil L1 and an electrode of a condenser C2 are coupled to the output terminal 7 of the semiconductor device 1a and also to an output voltage terminal VOUT. The other electrode of the condenser C2 is coupled to the ground terminal GND.

Further, the ground terminal 8 of the semiconductor device 1a is coupled to the ground terminal GND. Furthermore, the first gate terminal 9 and the second gate terminal 10 of the semiconductor device 1a are coupled to a driver IC 32, respectively. The driver IC 32 is also coupled to the ground terminal GND. The driver IC 32 has: a driver to drive the high side switch and the low side switch; and a control circuit to control the driver.

As is stated above, the semiconductor device 1a is configured by forming the high side switch and the low side switch of a non-insulated type DC/DC converter over a semiconductor chip 2.

Figure 9:
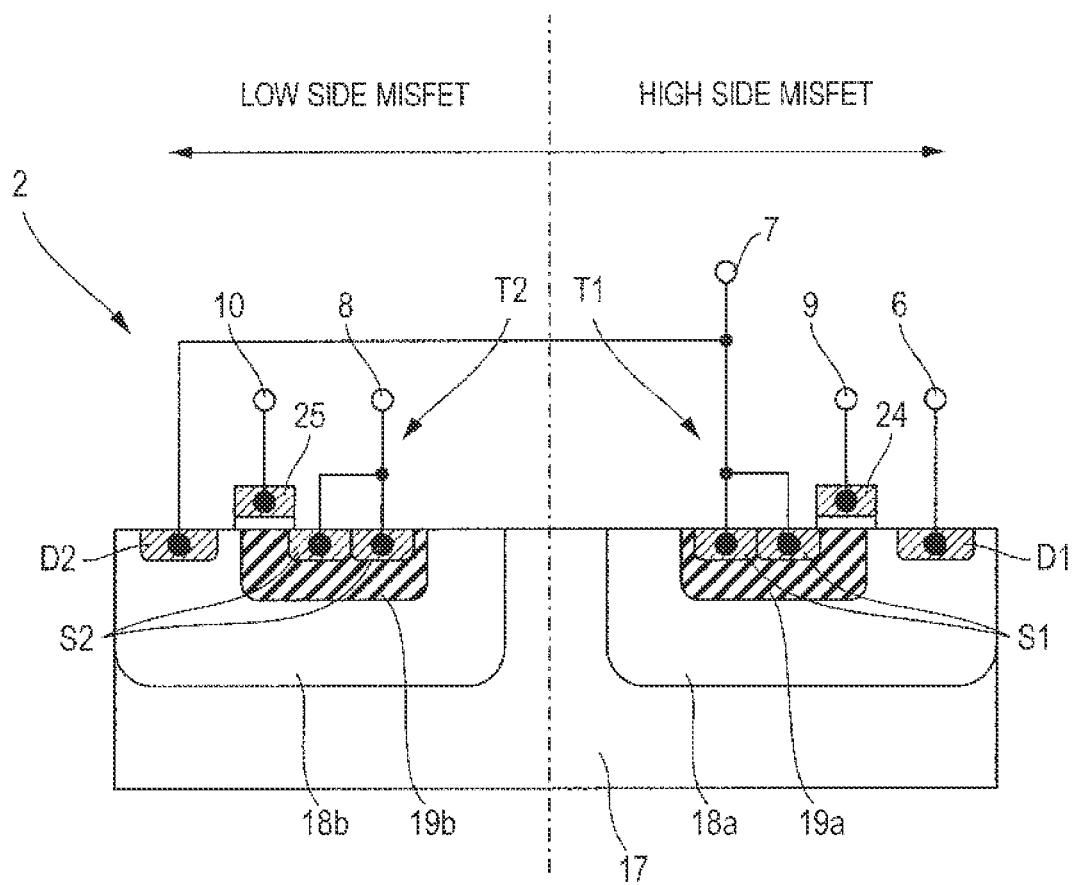
FIG. 9 is a schematic sectional view theoretically explaining the relation of connection of terminals in a semiconductor chip according to Embodiment 1.

FIG. 9 is a schematic sectional view theoretically explaining the relation of connection among the high side switch T1, the low side switch T2, and the terminals such as the input terminal 6, the output terminal 7, and the ground terminal 8 in the semiconductor device 1 or 1a.

In the figure, a representative structure is shown as the structure of the high side switch T1 and the low side switch T2 because of the schematic sectional view.

As is obvious from the figure, the drain region D1 of the high side switch T1 is electrically coupled to the input terminal 6. The source regions S1 of the high side switch T1 are electrically coupled to the drain region D2 of the low side switch T2 and they are coupled to the output terminal 7. Further, the source regions S2 of the low side switch T2 are electrically coupled to the ground terminal 8. The gate electrode 24 of the high side switch T1 is electrically coupled to the first gate terminal 9 and the gate electrode 25 of the low side switch T2 is electrically coupled to the second gate terminal 10, respectively.

Figure 10A:
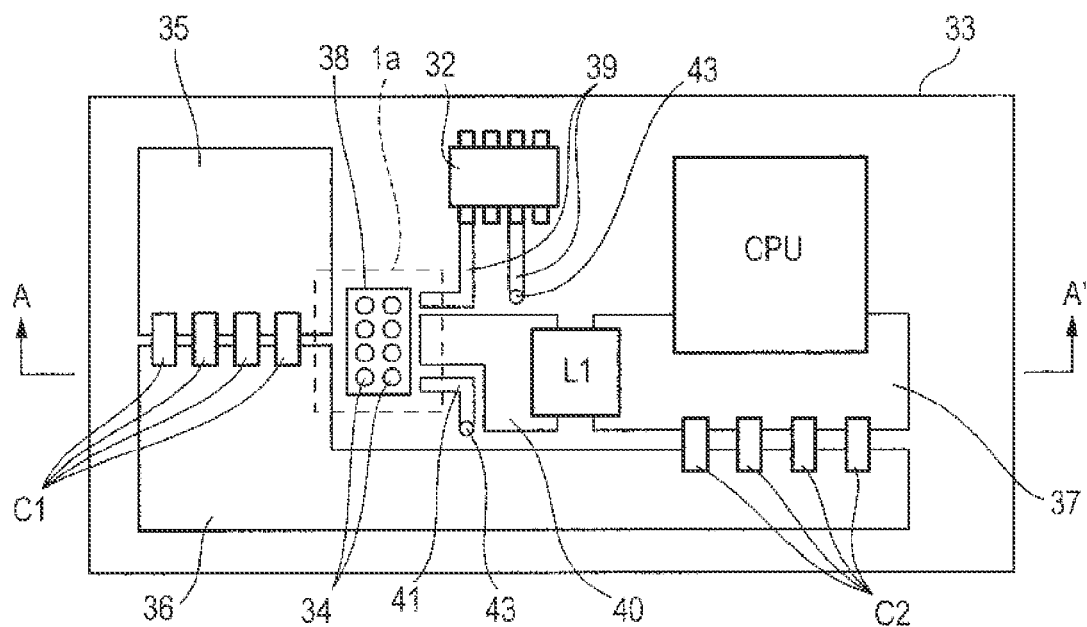
FIGS. 10A and 10B are views showing a mounting state in the case of forming a DC/DC converter by mounting a semiconductor device shown in FIGS. 1A to 7 on a wiring substrate.
Figure 10B:
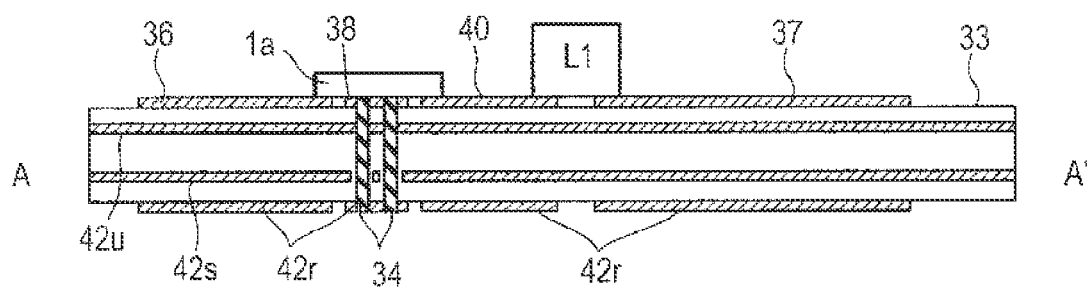

FIGS. 10A and 10B are views showing a mounting state in the case of forming a DC/DC converter by mounting the semiconductor device 1a over a wiring substrate 33 obtained by forming a multilayered wiring layer over a resinous insulating substrate, in which FIG. 10A is a schematic plan view and FIG. 10B is a sectional view taken on line A-A' thereof.

As is shown in the figures, the semiconductor device 1a is mounted over a site shown with the broken line. Further, a driver IC 32, condensers C1 and C2, a choke coil L1, and a central processing unit CPU are mounted over the wiring substrate 33 excluding the site shown with the broken line.

Furthermore, wires 35, 36, 37, 38, 39, 40, 41, and 42 are formed in the wiring substrate 33.

Then the semiconductor device 1a is coupled to the condenser C1, the driver IC 32, the choke coil L1, and others through the wires 35, 36, 37, 38, 39, 40, 41, and 42.

Further, as is obvious from FIG. 10B, the DC/DC converter is structured so as to dissipate the heat generated in the semiconductor device 1a toward the bottom face side of the wiring substrate 33 through the wires 34 and thermal vias 34.

Furthermore, through through holes 43, wires (the wire 36, for example) on the top face side of the wiring substrate 33 are coupled to a wire 42r on the bottom face side or an upper layer wire 42u is coupled to a lower layer wire 42s.

In the mounting over the wiring substrate 33, it is also possible to mount the semiconductor device 1 before sealed with resin, pot a resin for protection after the mounting, and thus protect the semiconductor device 1 with the potting resin.

In the semiconductor device 1 or 1a stated above, the input terminal 6 is coupled to the drain region D1 of the high side switch T1 through the first metal plate wire 3 having the pectinate parts 3a and 3b, the plural solder bumps 30, and the strip-shaped drain pads 28. Further, the output terminal 7 is coupled to the source regions S1 of the high side switch T1 and the drain region D2 of the low side switch T2 through the second metal plate wire 4 having the pectinate parts 4a, 4b, 4c, and 4d, the plural solder bumps 30 and 31, and the strip-shaped source pads 26 and the drain pads 29. The ground terminal 8 is coupled to the source regions S2 of the low side switch T2 through the third metal plate wire 5 having the pectinate parts 5a, 5b, and 5c, the plural solder bumps 31, and the strip-shaped source pads 27.

That is, since the drain regions D1 and D2 and the source regions S1 and S2 of the high side switch T1 and the low side switch T2 are coupled to the input terminal 6, the output terminal 7, and the ground terminal 8 through the wide first, second, and third metal plate wires 3, 3a, 3b, 4, 4a, 4b, 4c, 4d, 5, 5a, 5b, and 5c, and the strip-shaped source pads 26 and 27 and drain pads 28 and 29, it is possible to improve heat dissipation and also reduce a parasitic resistance.

Since metal plate wires are used for the connections in particular, it is possible to attain the improvement of heat dissipation and the reduction of a parasitic resistance far better than the case of connections with wires.

Further, when a frame including a solid plate used as the heat sink 11 is coupled to the other principal surface (bottom face of the semiconductor chip) on the other side of the principal surface of the semiconductor chip 2, the heat dissipation from the bottom face of the semiconductor chip 2 improves further.

Further, the thermal vias 34 are formed immediately under the semiconductor device 1a in the state of mounting the semiconductor device 1a over the thermal vias 34 formed in the wiring substrate 33 and hence the heat dissipation from the inner layer of the wiring substrate 33 through the bottom face improves further.

Further, as is obvious from FIGS. 2A to 4B, the source pads 26 of the high side switch T1 and the drain pads 29 of the low side switch T2 are adjacently formed on identical lines over the principal surface of the semiconductor chip 2 in a planar view. The solder bumps 30 and the solder bumps 31 are formed on the sides where the source pads 26 and the drain pads 29 face each other. The source pads 26 of the high side switch T1 are electrically coupled to the drain pads 29 of the low side switch T2 through one (common) metal plate wire by coupling the pectinate part 4b of the second metal plate wire 4 over the solder bumps 30 and 31. That is, the pectinate part 4b of the second metal plate wire 4 is coupled in the manner of straddling over the first region R1 of the high side switch T1 and the second region R2 of the low side switch T2. In this way, it is possible to reduce a wire inductance and obtain various effects including the improvement of an electric power source efficiency, the reduction of a surge voltage, the suppression of noises, etc.

A manufacturing method of a semiconductor device 1 is explained hereunder on the basis of FIGS. 11 to 16.

(a) Process

Figure 11:
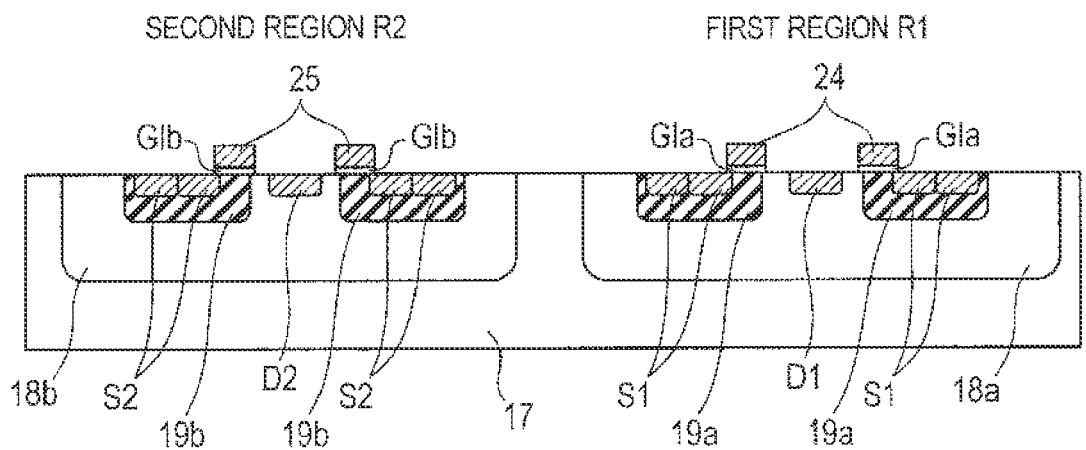
FIG. 11 is a sectional view in (a) process showing a manufacturing method of a semiconductor device according to Embodiment 1.

As is shown in FIG. 11, N-type well regions 18a and 18b are formed in a selective first region R1 and a second region R2 that is different from the first region R1 over the principal surface of a semiconductor substrate 17 constituting a semiconductor wafer and P-type well regions 19a and 19b are formed in the N-type well regions 18a and 18b, respectively. Then gate electrodes 24 and 25 are formed over the principal surface where the N-type well regions 18a and 18b are formed through gate insulation films GIa and GIb.

Further, source regions S1 and S2 are formed in the P-type well regions 19a and 19b over the principal surface and moreover drain regions D1 and D2 are formed in regions distant from the source regions S1 and S2 and the P-type well regions 19a and 19b in the N-type well regions 18a and 18b.

In this way, the N-type well region 18a, the P-type well regions 19a, the source regions S1, the drain region D1, and the gate electrodes 24 are formed in the first region R1. Then the N-type well region 18b, the P-type well regions 19b, the source regions S2, the drain region D2, and the gate electrodes 25 are formed in the second region R2.

(b) Process

Figure 12:
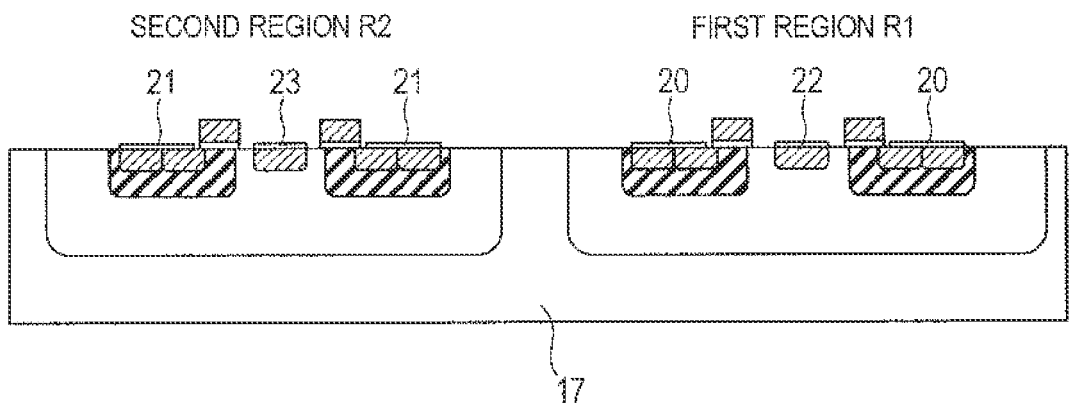
FIG. 12 is a sectional view in (b) process showing a manufacturing method of a semiconductor device according to Embodiment 1.

As is shown in FIG. 12, source electrodes 20 and 21 are formed over the source regions S1 and S2 and drain electrodes 22 and 23 are formed over the drain regions D1 and D2, respectively.

(c) Process

Figure 13:
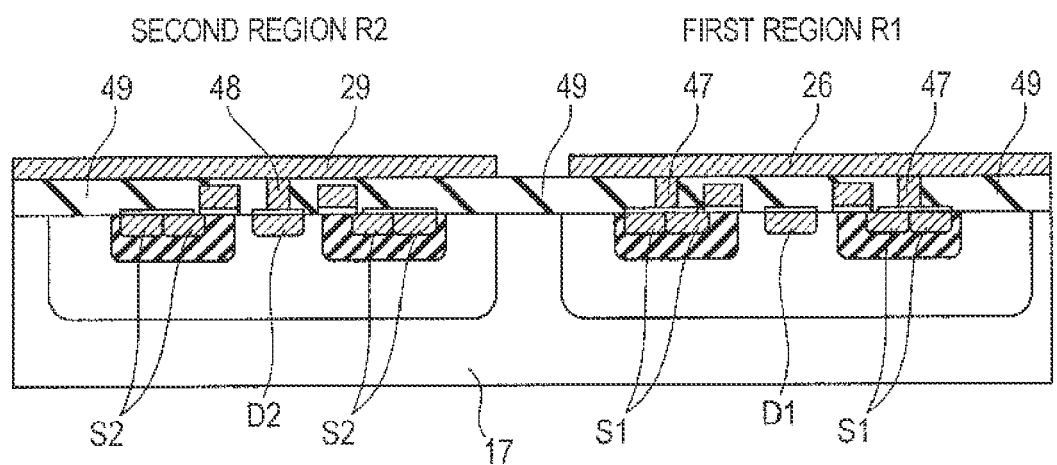
FIG. 13 is a sectional view in (c) process showing a manufacturing method of a semiconductor device according to Embodiment 1.

As is shown in FIG. 13, a first interlayer insulation film 49 is formed over the gate electrodes 24 and 25, the source electrodes 20 and 21, and the drain electrodes 22 and 23 so as to cover them. As the first interlayer insulation film 49, a CVD film such as a CVD-$SiO_2$ film is used.

As a method for forming a CVD film, a plasma CVD method, a thermal CDV method, or the like is used.

Then tungsten plugs (connecting plugs) 47 and 48 are formed by selectively removing the first interlayer insulation film 49 over the source electrodes 20 and the drain electrode 23 and embedding a tungsten film in the removed parts. Successively, a source pad 26 and a drain pad 29 are formed by forming an aluminum (Al) film over the first interlayer insulation film 49 by a sputtering technology or the like and selectively removing the Al film. Here, a source pad 27 and a drain pad 28 are not shown in FIG. 13. The selective removal of the Al film is carried out by selective etching by a photolithography technology using a photoresist for example.

A source pad 27, a drain pad 28, and tungsten plugs (connecting plugs) coupled to them not shown in FIG. 13 are formed also by the same method as described above.

The source pad 26 is coupled to the source regions S1 of the high side switch T1 through the tungsten plugs 47 and the drain pad 29 is coupled to the drain region D2 of the low side switch T2 through the tungsten plug 48, respectively.

A source pad 27 and a drain pad 28 not shown in FIG. 13 are also coupled to the high side switch T1 and the low side switch T2 through tungsten plugs in the same way as described above. A source pad 27 is coupled to source regions S2 of the low side switch T2 and a drain pad 28 is coupled to the drain region D1 of the high side switch T1, respectively.

The source pads 26 and 27 and the drain pads 28 and 29 have strip-shapes or rectangular shapes in a planar view as is shown in FIGS. 4A and 4B.

(d) Process

Figure 14:
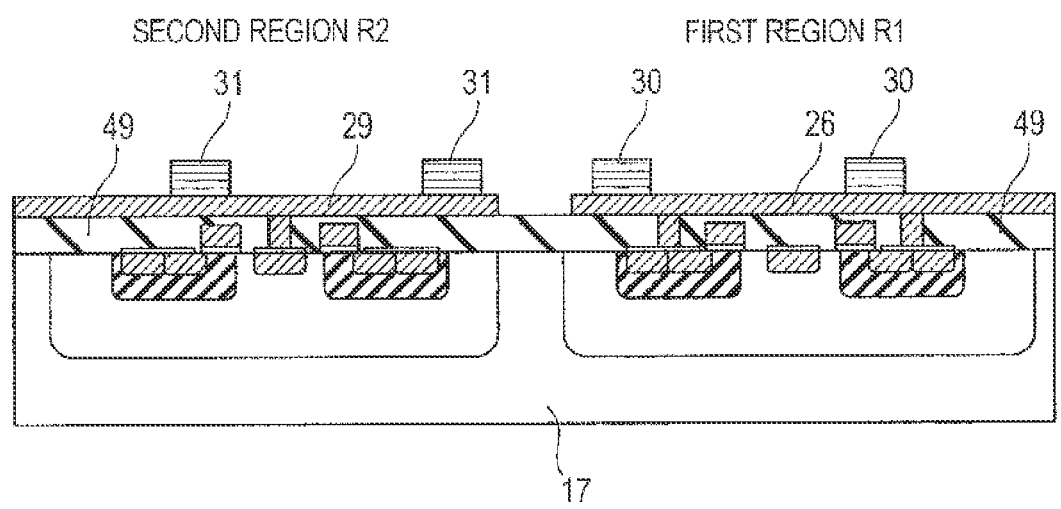
FIG. 14 is a sectional view in (d) process showing a manufacturing method of a semiconductor device according to Embodiment 1.

As is shown in FIG. 14, a plurality of solder bumps 30 and 31 are formed selectively over the source pad 26 and the drain pad 29. On this occasion, the solder bumps 30 and 31 are formed at sites of the adjacent source pad 26 and drain pad 29 closer to each other (positioned as shown in FIG. 2B).

Further, solder bumps 30 and 31 are formed also over a source pad 27 and a drain pad 28 not shown in FIG. 14 in the same way as described above. On this occasion, the solder bumps 30 and 31 are formed at sites of the adjacent source pad 27 and drain pad 28 more distant from the ends facing each other (positioned as shown in FIG. 2B).

The solder bumps 30 and 31 are obtained by forming an Ni—Au plated film as an underlayer film in advance and forming them over the Ni—Au underlayer film.

Otherwise, it is also possible to form an Au ball or a Cu ball instead of a solder bump.

(e) Process

Figure 15:
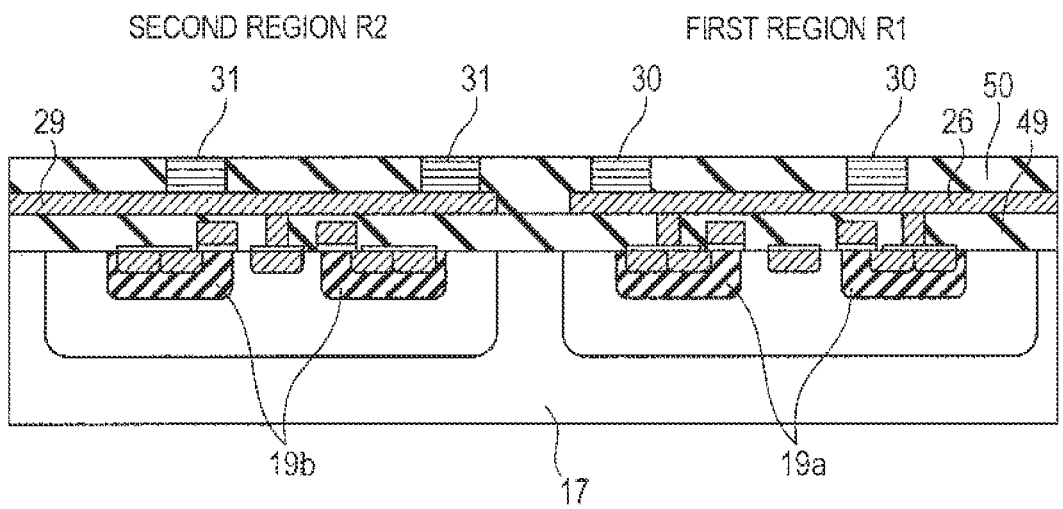
FIG. 15 is a sectional view in (e) process showing a manufacturing method of a semiconductor device according to Embodiment 1.

As is shown in FIG. 15, a second interlayer insulation film 50 is formed over the source pad 26 and the drain pad 29 so as to embed the solder bumps 30 and 31 but expose the top faces of the solder bumps 30 and 31.

The second interlayer insulation film 50 is formed also over a source pad 27 and a drain pad 28 not shown in FIG. 15 in the same way as described above. On this occasion, the second interlayer insulation film 50 is formed so as to expose the top faces of the solder bumps 30 and 31 over the source pad 27 and the drain pad 28 in the same way as described above.

As the second interlayer insulation film 50, any one of a polyimide film, a CVD-$SiO_2$ film, and a CVD-SiN film or any one of the composite films thereof or a laminated film thereof is used.

At this moment, a so-called semiconductor wafer processed at preceding processes is completed.

(f) Process

A semiconductor wafer after finishing the (e) process is divided into a plurality of semiconductor chips 2 each of which has a first region R1 and a second region R2. At this moment, a semiconductor chip 2 is prepared.

(g) Process

Figure 16:
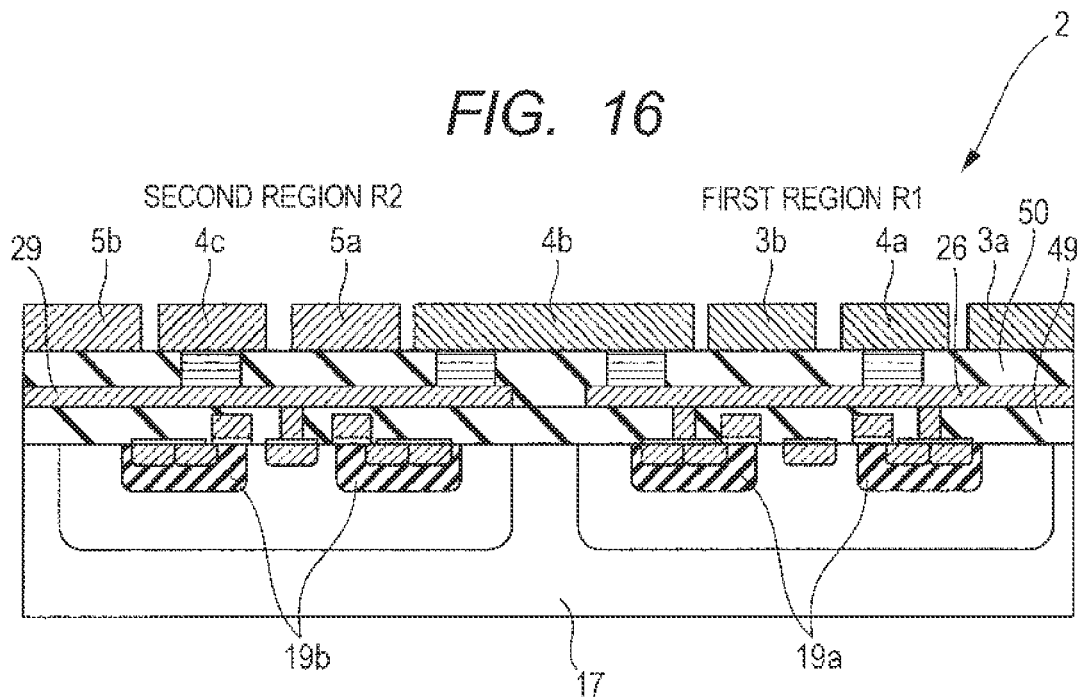
FIG. 16 is a sectional view in (g) process showing a manufacturing method of a semiconductor device according to Embodiment 1.

As is shown in FIG. 16, first metal plate wires 3, 3a, and 3b, second metal plate wires 4, 4a, 4b, 4c, and 4d, and third metal plate wires 5, 5a, 5b, and 5c are: mounted over the top faces of the exposed solder bumps 30 and 31 and the second interlayer insulation film 50 of the semiconductor chip 2; and coupled to the solder bumps 30 and 31. Here, although metal plate wires 4d and 5c are not shown in FIG. 16, the existence thereof is obvious from FIGS. 1A and 1B and they are coupled to solder bumps in the same way as described above.

Figure 17A:
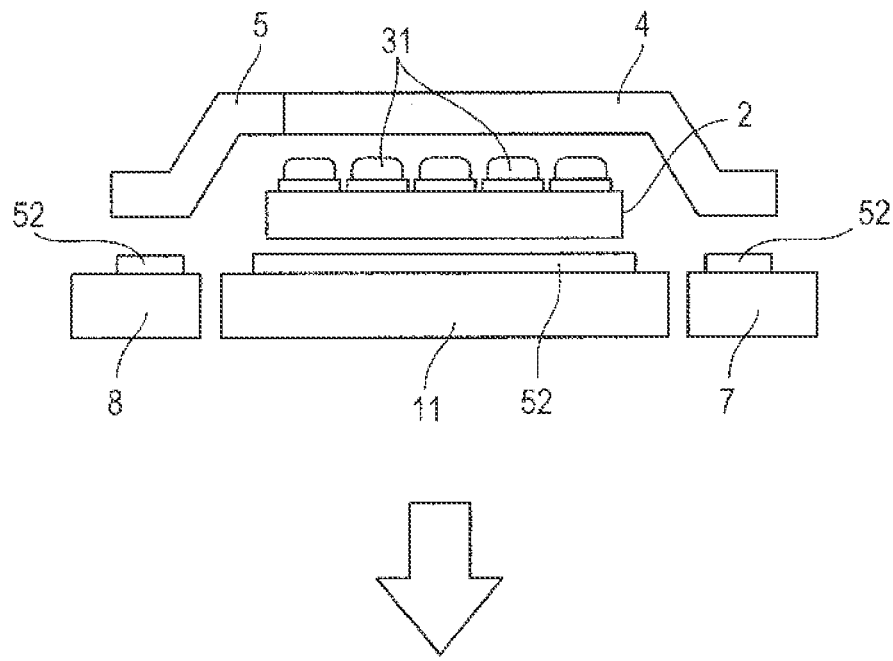
FIGS. 17A and 17B are sectional views supplementing the (g) process in the manufacturing method.
Figure 17B:
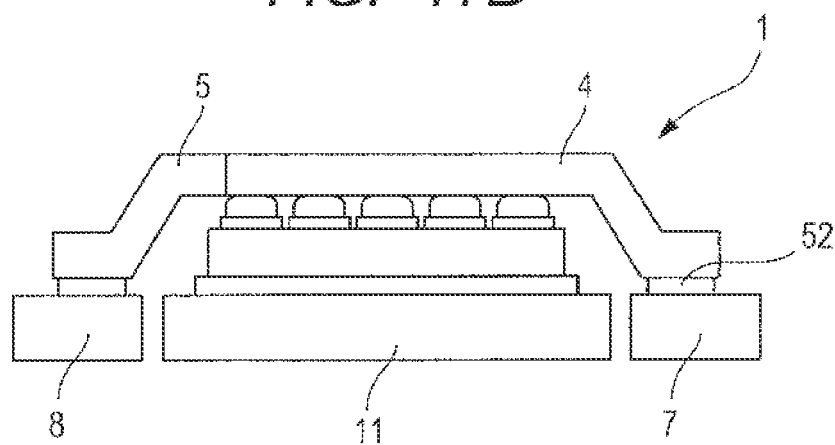

FIGS. 17A and 17B are sectional views supplementing the FIG. 16 process in FIGS. 17A and 17B. The cross sections in FIGS. 17A and 17B are the cross sections at the site identical to the cross section in FIG. 7 but are in the state of not yet being sealed with resin. Here, only the solder bumps represented by the reference numeral 31 are shown. A heat sink 11, an output terminal 7, and a ground terminal 8 are shown but an input terminal 6, a first gate terminal 9, and a second gate terminal 10 are omitted in FIG. 7 because of a cross section of a specific site. Further, the first interlayer insulation film 49 and the second interlayer insulation film 50 shown in FIG. 16 also omitted.

As is shown in FIG. 17A, the second metal plate wire 4 and the third metal plate wire 5 are located over the semiconductor chip 2 where the solder bumps 30 and 31 are formed. Only the solder bumps represented by the reference numeral 31 are shown because of the sectional view. As is shown in FIG. 17B, the second metal plate wire 4 and the third metal plate wire 5, the solder bumps 30 and 31, and the output terminal 7 and the ground terminal 8 are coupled to each other. Further, the semiconductor chip 2 is coupled to the heat sink 11. Only the solder bumps represented by the reference numeral 31 are shown because of the sectional view. An adhesive 52 having a good heat dissipation is used for the coupling between the semiconductor chip 2 and the heat sink 11, the coupling between the second metal plate wire 4 and the output terminal 7, and the coupling between the third metal plate wire 5 and the ground terminal 8, respectively.

Successively, the semiconductor device 1 is sealed with an encapsulation resin 46 by a transfer mold method for example and thus a semiconductor device 1a is formed.

Embodiment 2

Figure 18:
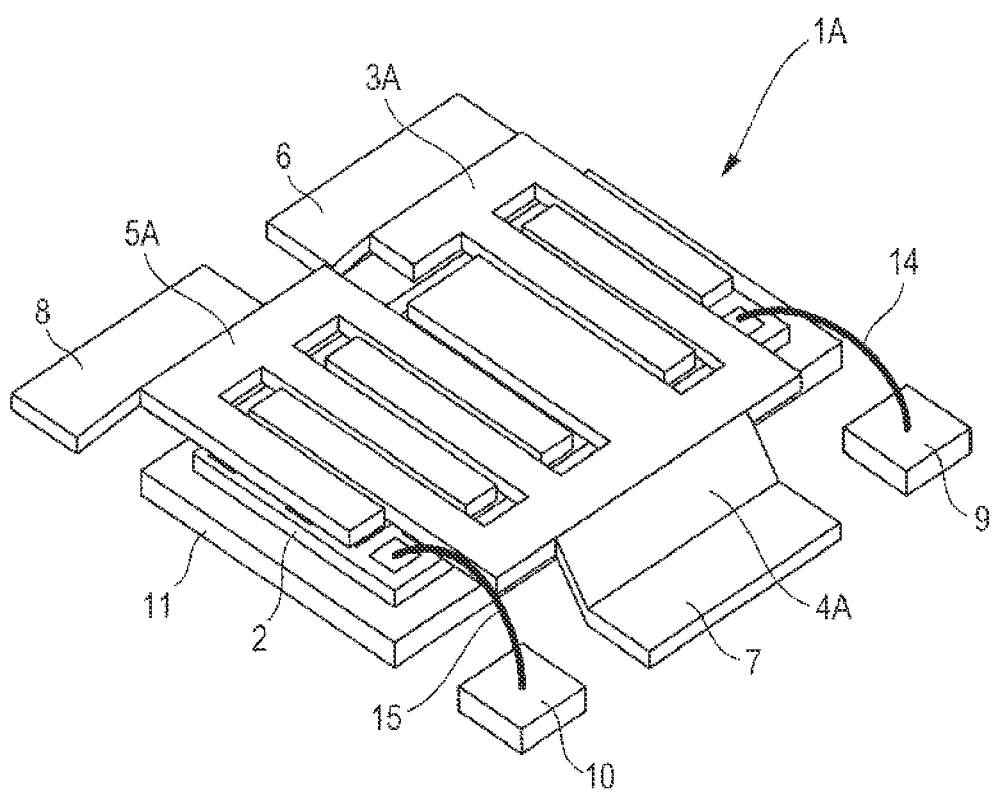
FIG. 18 is a perspective view showing a semiconductor device according to Embodiment 2.

FIG. 18 is a perspective view showing a semiconductor device according to Embodiment 2.

Embodiment 2 is a case of forming the input terminal 6, the output terminal 7, and the ground terminal 8 in the semiconductor device 1 shown in FIG. 1 as Embodiment 1 with parts of the first, second, and third metal plate wires, respectively. That is, this is a case of forming an input terminal 6 with a part of a first metal plate wire 3A, an output terminal 7 with a part of a second metal plate wire 4A, and a ground terminal 8 with a part of a third metal plate wire 5A, respectively. Others than those are the same as Embodiment 1.

In Embodiment 2, since it is unnecessary to use an input terminal 6, an output terminal 7, and a ground terminal 8 respectively, it is possible not only to obtain effects similar to Embodiment 1 but also to reduce the number of the manufacturing processes and the manufacturing cost of a semiconductor device 1A.

Embodiment 3

Figure 19:
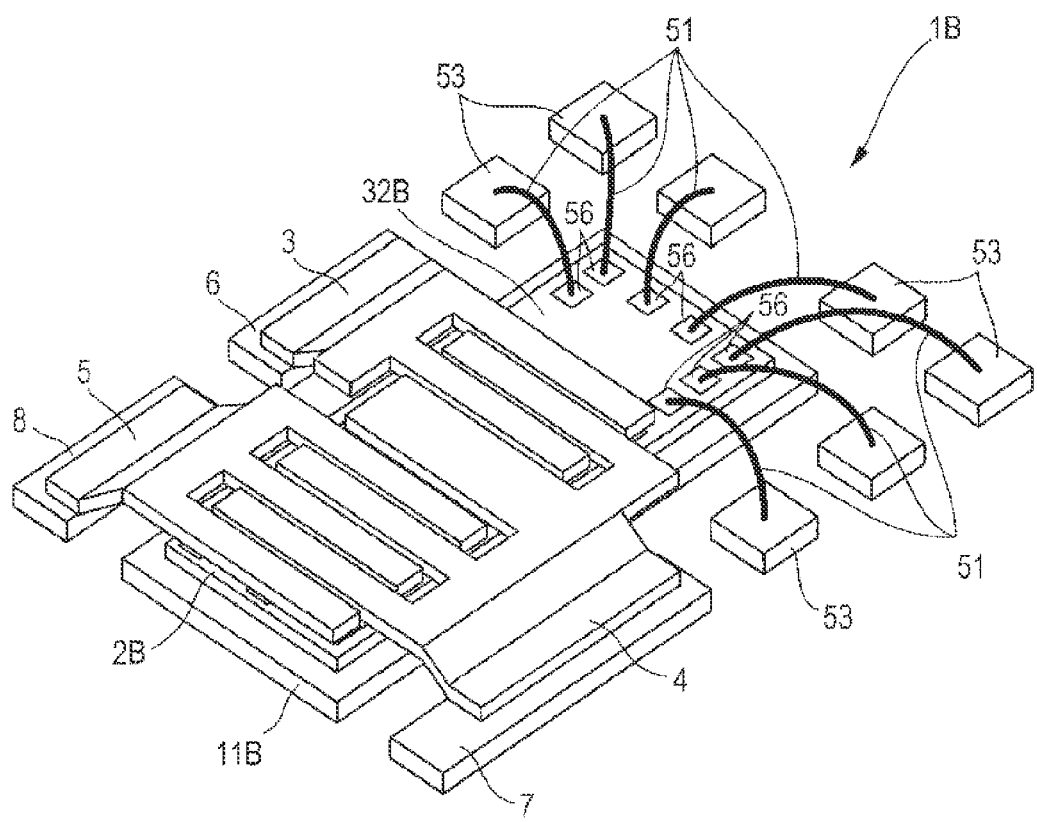
FIG. 19 is a perspective view showing a semiconductor device according to Embodiment 3.

FIG. 19 is a perspective view showing a semiconductor device according to Embodiment 3.

In Embodiment 3, as is shown in FIG. 19, in addition to the high side switch T1 and the low side switch T2 shown in Embodiment 1, a drive control circuit 32B having the function of the driver IC 32 is formed over the principal surface of a semiconductor chip 2B.

As is shown in the figure, a drive control circuit 32B, a high side switch T1 and a low side switch T2 are formed in the longitudinal direction over the principal surface of a rectangular semiconductor chip 2B.

A plurality of bonding pads 56 are coupled to a plurality of terminals 53 through a plurality of bonding wires (third bonding wires) 51 in the drive control circuit 32B.

Figure 20A:
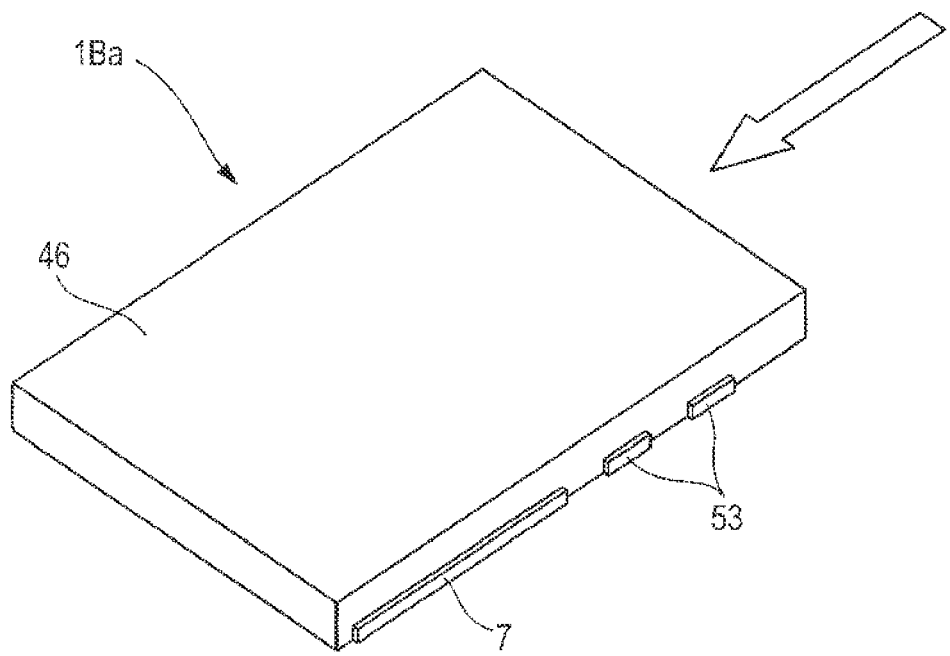
FIGS. 20A and 20B are views showing an external appearance in the case of sealing a semiconductor device in FIG. 19 with resin.
Figure 20B:
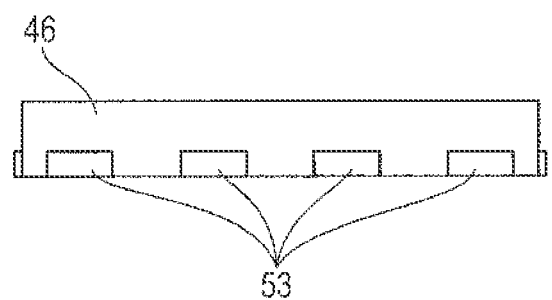

FIGS. 20A and 20B are views showing the state of sealing the semiconductor device 1B shown in FIG. 19 with resin, in which FIG. 20A is a perspective view thereof and FIG. 20B is a side view viewed from the direction of the arrow.

Figure 21A:
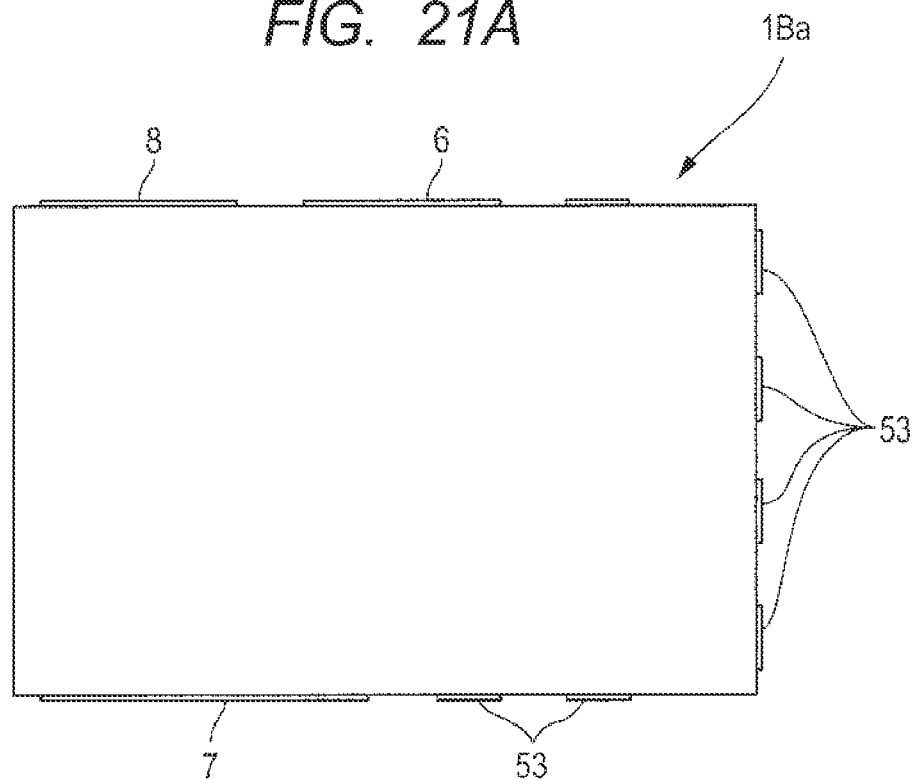
FIG. 21A is a top view and FIG. 21B is a bottom view of a semiconductor device shown in FIGS. 20A and 20B.
Figure 21B:
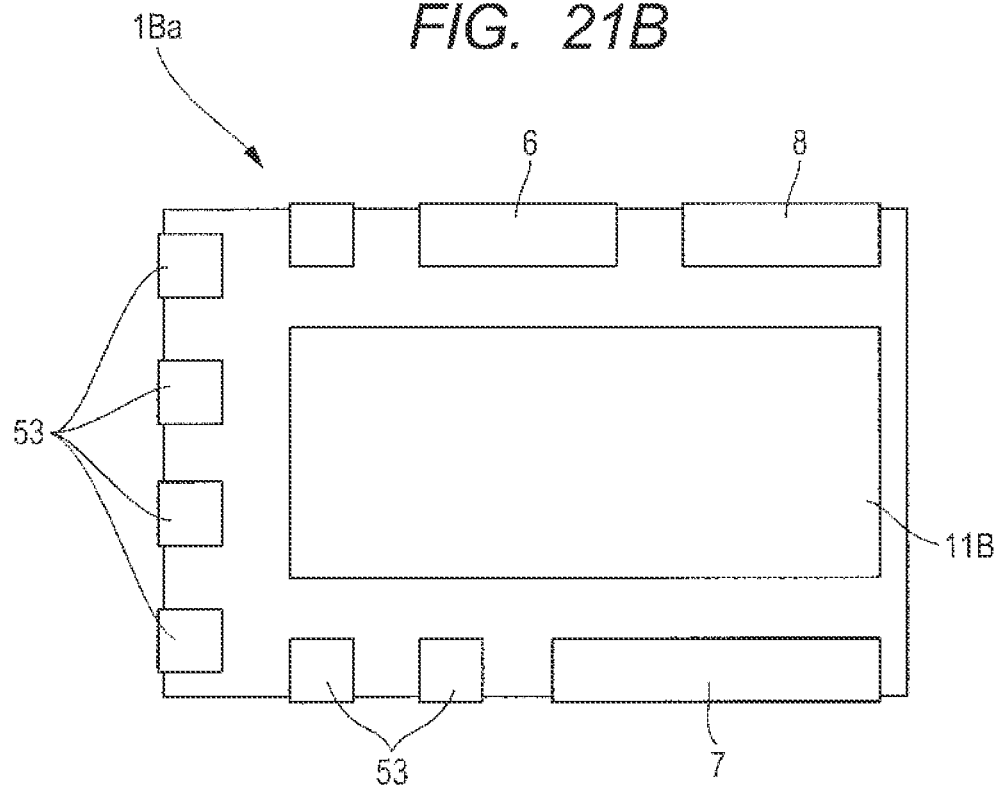

Further, FIG. 21A is a top view and FIG. 21B is a bottom view of the semiconductor device 1Ba shown in FIGS. 20A and 20B.

A semiconductor device 1Ba is obtained by sealing the semiconductor device 1B with resin by a transfer mold technology for example.

In the semiconductor device 1Ba sealed with an encapsulation resin 46, respective parts of an input terminal 6, an output terminal 7, a ground terminal 8, and plural terminals 53 in the drive control circuit 32B are exposed on the side faces of the encapsulation resin 46.

Further, as is shown in FIG. 21B, respective parts of a heat sink 11B, the input terminal 6, the output terminal 7, the ground terminal 8, and the plural terminals 53 in the drive control circuit 32B are exposed on the bottom face of the encapsulation resin 46.

Although the external appearance of each of the top face, the bottom face, and the side faces of the encapsulation resin 46 of the semiconductor device 1Ba has a quadrangular shape, each of them may have an external appearance having chamfered corners.

Figure 22:
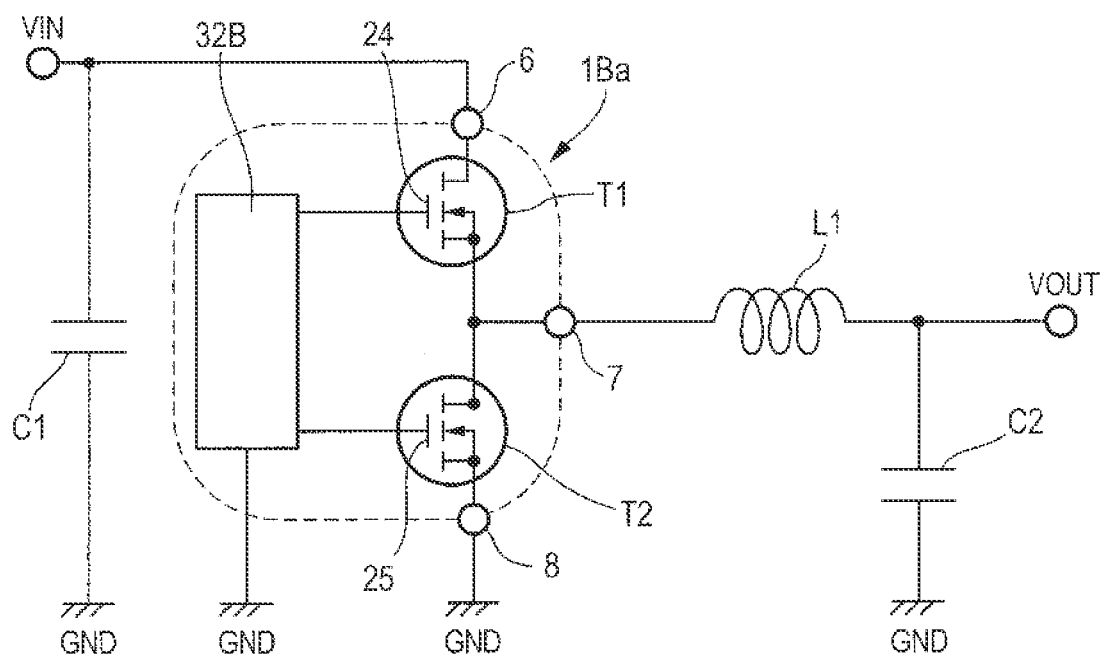
FIG. 22 is an equivalent circuit schematic in the case of using a semiconductor device shown in FIGS. 19 to 21B for a DC/DC converter.

FIG. 22 is an equivalent circuit schematic in the case of using a semiconductor device 1Ba for a DC/DC converter.

An input terminal 6 in the semiconductor device 1Ba is coupled to an input voltage terminal VIN and also to an electrode of a condenser C1 and the other electrode of the condenser C1 is coupled to a ground terminal GND. Then a choke coil L1 and an electrode of a condenser C2 are coupled to an output terminal 7 in the semiconductor device 1Ba and also coupled to an output voltage terminal VOUT. The other electrode of the condenser C2 is coupled to the ground terminal GND.

Further, a ground terminal 8 in the semiconductor device 1Ba is coupled to the ground terminal GND.

Furthermore, a gate electrode 24 of a high side switch T1 and a gate electrode 25 of a low side switch T2 in the semiconductor device 1Ba are coupled to a drive control circuit 32B respectively in a semiconductor chip 2B. That is, the gate electrode 24 of the high side switch T1 and the gate electrode 25 of the low side switch T2 are coupled to the drive control circuit 32B respectively through wires including a diffusion layer formed in the semiconductor chip 2B or wires including a metal layer, wires including a polycrystalline silicon layer, or wires including the combination thereof, those being formed over the semiconductor chip 2B. Further, the drive control circuit 32B is also coupled to the ground potential GND.

In such Embodiment 3, since a high side switch T1, a low side switch T2, and a drive control circuit 32B are formed in a semiconductor chip 2B and they are coupled in the semiconductor chip 2B, it is possible to reduce wiring resistance between elements and further reduce noises. Further, it is possible to further reduce a wiring inductance. Furthermore, in Embodiment 3, effects similar to Embodiment 1 can be obtained.

Embodiment 4

Figure 23:
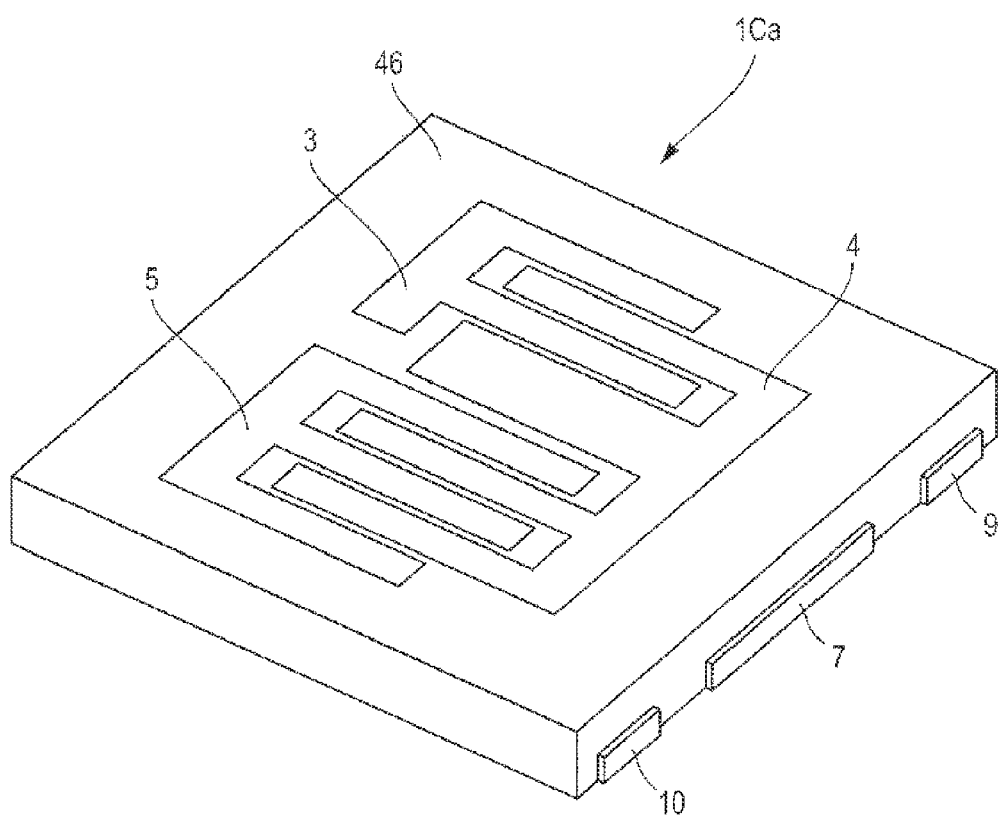
FIG. 23 is a perspective view showing a resin-sealed type semiconductor device according to Embodiment 4.

FIG. 23 is a perspective view showing a semiconductor device according to Embodiment 4.

In a semiconductor device 1Ca, as is obvious from the figure, respective parts of a first metal plate wire 3, a second metal plate wire 4, and a third metal plate wire 5 are exposed from the surface of an encapsulation resin 46 of a semiconductor device 1a. Others than that are identical to Embodiments 1 and 2.

In Embodiment 4, it is possible not only to obtain effects similar to Embodiment 1 but also to improve heat dissipation from the surface side of an encapsulation resin 46. Further, it is possible to further improve the heat dissipation by coupling radiation fins or the like to the exposed parts.

Embodiment 5

Figure 24:
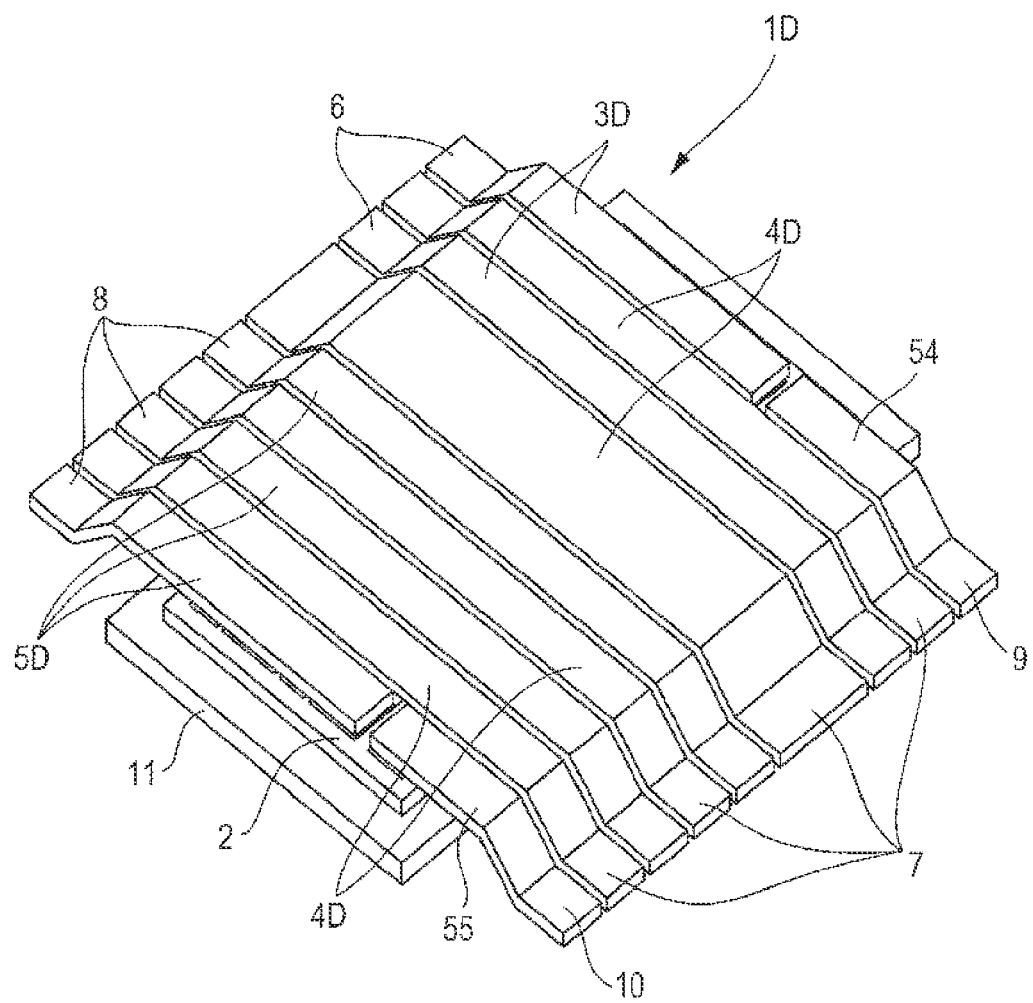
FIG. 24 is a perspective view showing a semiconductor device according to Embodiment 5.

FIG. 24 is a perspective view showing a semiconductor device according to Embodiment 5.

Figure 25A:
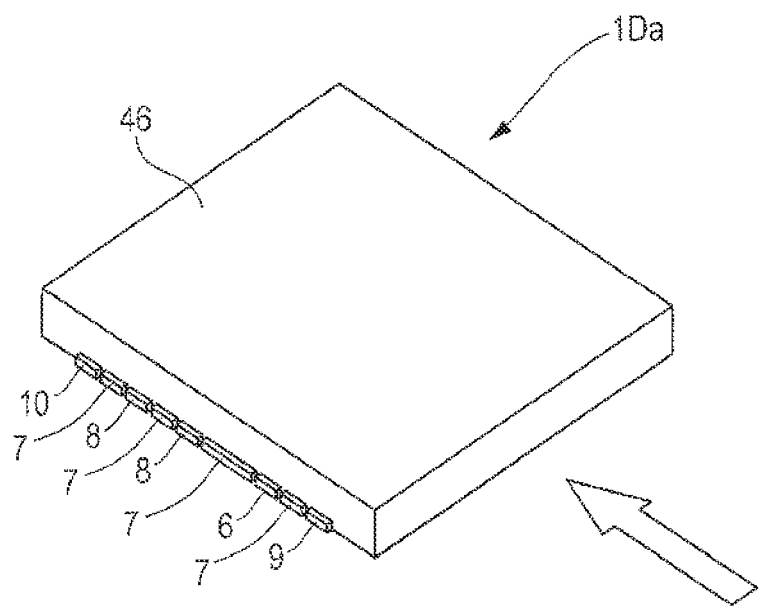
FIGS. 25A and 25B are views showing an external appearance in the case of sealing a semiconductor device in FIG. 24 with resin.
Figure 25B:
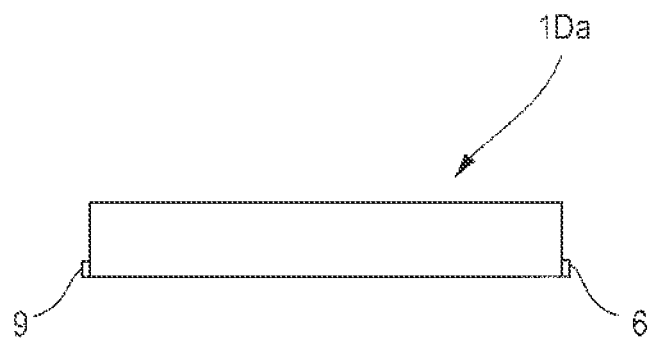

FIGS. 25A and 25B are views showing the state of sealing the semiconductor device 1D shown in FIG. 24 with an encapsulation resin 46, in which FIG. 25A is a perspective view thereof and FIG. 25B is a side view viewed from the direction indicated with the solid-white arrow.

Figure 26A:
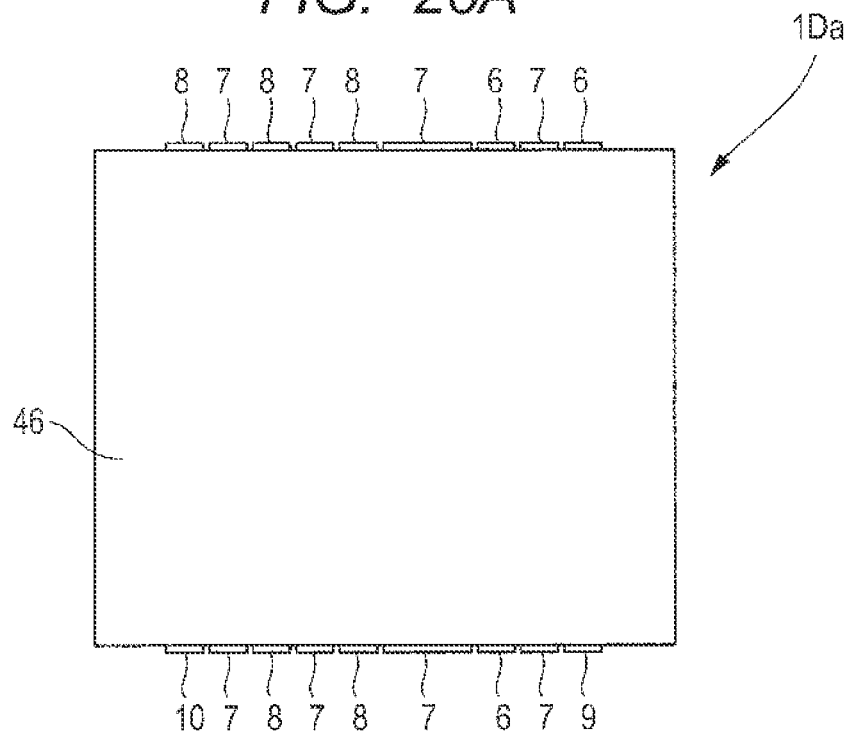
FIG. 26A is a top view and FIG. 26B is a bottom view of a semiconductor device shown in FIGS. 25A and 25B.
Figure 26B:
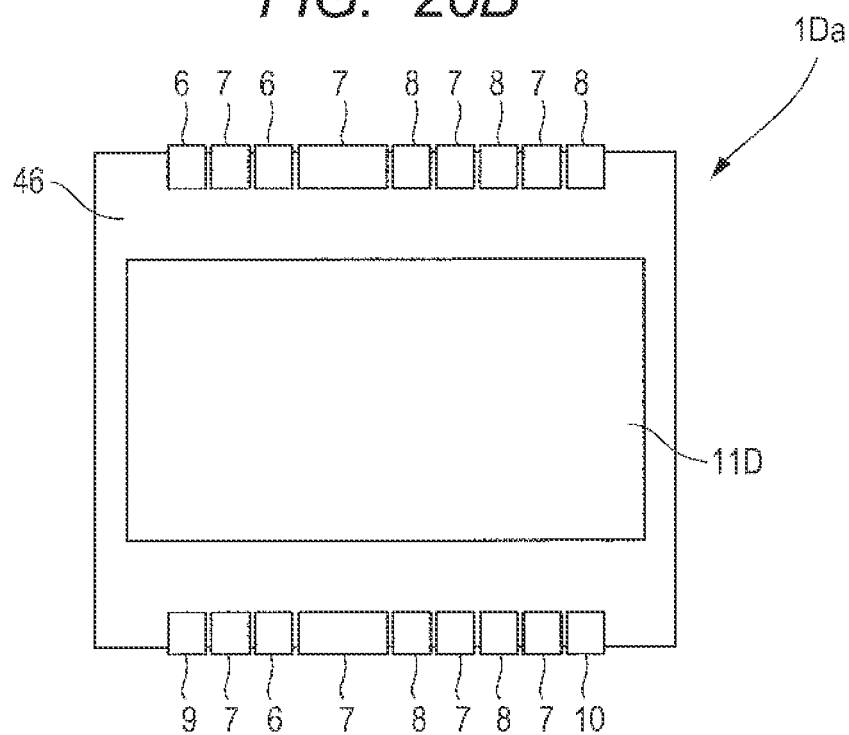

FIG. 26A is a top view and FIG. 26B is a bottom view of the semiconductor device 1Da shown in FIGS. 25A and 25B.

Embodiment 5 is based on a semiconductor chip 2 according to Embodiment 1, namely a semiconductor chip 2 in the state of having source pads 26 and 27, drain pads 28 and 29, solder bumps 30 and 31, a first gate electrode pad 12, and a second gate electrode pad 13.

The semiconductor chip 2 is prepared and a plurality of long and thin first metal plate wires 3D, a plurality of second metal plate wires 4D, and a plurality of third metal plate wires 5D are allocated respectively over the semiconductor chip 2 as shown in FIG. 24 and coupled to solder bumps 30 and 31 respectively.

As is shown in FIG. 24, the plural first metal plate wires 3D and the plural second metal plate wires 4D are allocated alternately and the plural second metal plate wires 4D and the plural third metal plate wires 5D are also allocated alternately over the top plane of the semiconductor chip 2.

Further, a fourth metal plate wire 54 is coupled to the first gate electrode pad 12 and a fifth metal plate wire 55 is coupled to the second gate electrode pad 13, respectively.

Then the first metal plate wires 3D have input terminals 6 at sites distant from above the semiconductor chip 2.

Further, the second metal plate wires 4D have output terminals 7 at sites distant from above the semiconductor chip 2.

Furthermore, the third metal plate wires 5D have ground terminals 8 at sites distant from above the semiconductor chip 2.

Each of the first metal plate wires 3D, the second metal plate wires 4D, the third metal plate wires 5D, the fourth metal plate wire 54, and the fifth metal plate wire 55 includes a horizontally long plate.

In Embodiment 5, source pads 26 of a high side switch T1 and drain pads 29 of a low side switch T2 are coupled through the second metal plate wires 4D including a metal plate. That is, the second metal plate wires 4D are commonly used for the coupling.

A semiconductor device 1Da is formed by sealing the semiconductor device 1D with resin by a transfer mold technology for example. In the semiconductor device 1Da sealed with an encapsulation resin 46, respective parts of an input terminal 6, an output terminal 7, a ground terminal 8, a first gate terminal 9, and a second gate terminal 10 are exposed on a side face of the encapsulation resin 46. Further, respective parts of a heat sink 11, the input terminal 6, the output terminal 7, the ground terminal 8, the first gate terminal 9, and the second gate terminal 10 are exposed on the bottom face of the encapsulation resin 46 as is shown in FIG. 26B. Although the external appearance of each of the top face, the bottom face, and the side faces of the encapsulation resin 46 of the semiconductor device 1Da has a quadrangular shape, each of them may have an external appearance having chamfered corners.

In such Embodiment 5, it is possible to attain the reduction of a wire inductance, the improvement of heat dissipation, the reduction of a parasitic resistance, etc. in the same way as Embodiments 1 to 4.

Further, since the first, second, and third metal plate wires 3D, 4D, and 5D have simple shapes, the manufacturing and processing are facilitated and the manufacturing cost of a semiconductor device is reduced.

Embodiment 6

Figure 27A:
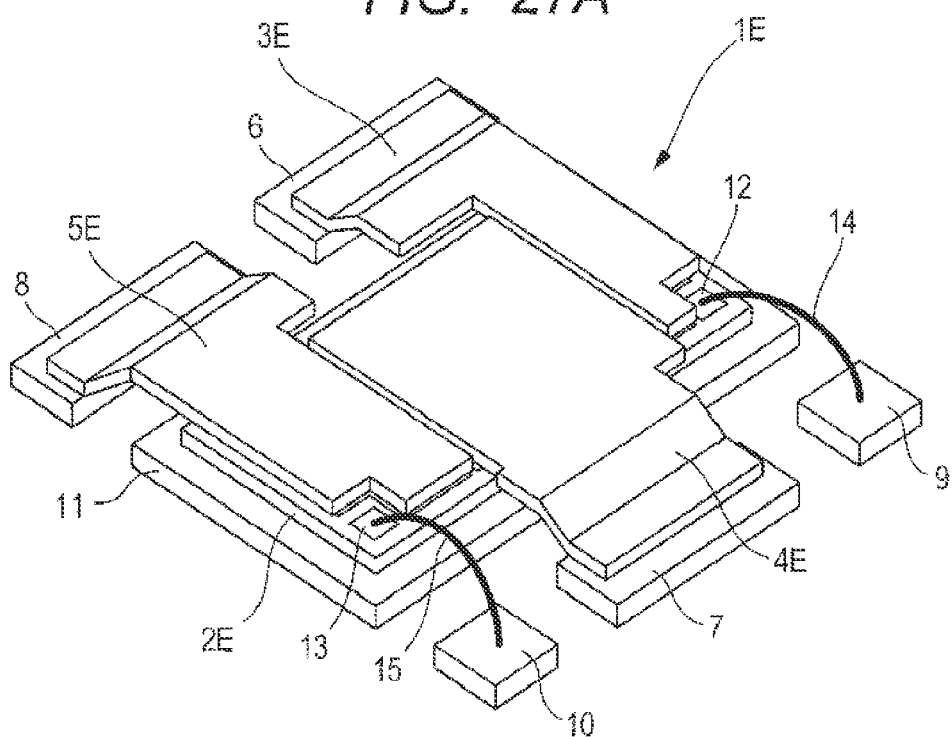
FIGS. 27A and 27B are perspective views showing a semiconductor device according to Embodiment 6.
Figure 27B:
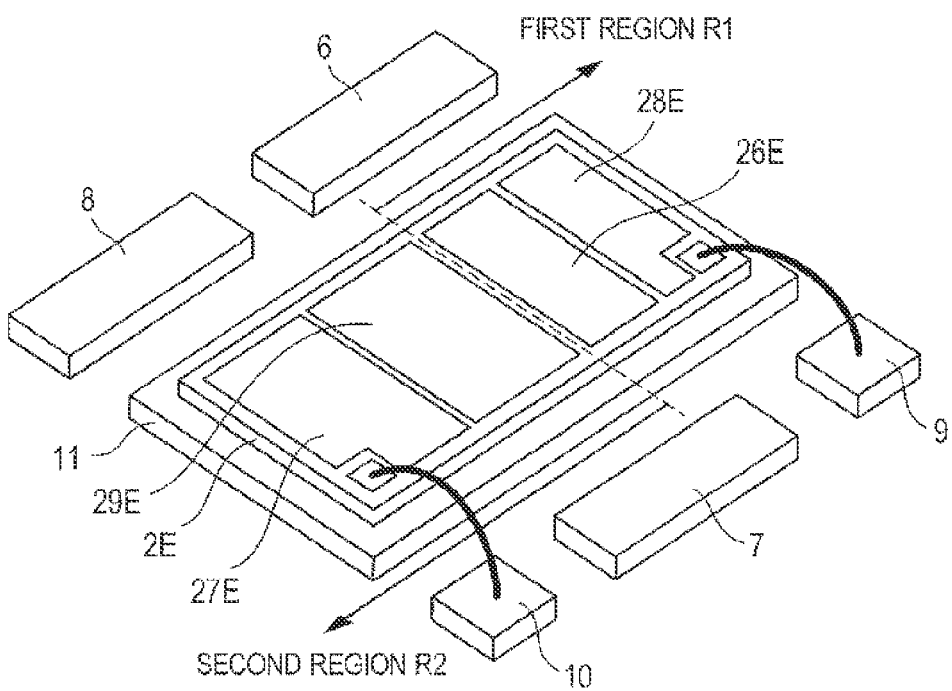

FIGS. 27A and 27B are perspective views showing a semiconductor device according to Embodiment 6. FIG. 27A represents the state of not being sealed with an encapsulation resin and FIG. 27B represents the state of removing a first metal plate wire, a second metal plate wire, and a third metal plate wire from the state in FIG. 27A.

In Embodiment 6, strip-shaped source pads 26 and 27 and drain pads 28 and 29 are not allocated over a high side switch T1 and a low side switch T2 respectively unlike Embodiments 1 to 5 and planar source pads 26E and 27E and planar drain pads 28E and 29E are allocated over a first region R1 where a high side switch T1 exists and a second region R2 where a low side switch T2 exists as shown in FIG. 27B.

That is, the source pad 26E and the drain pad 28E are allocated over the first region R1 and the source pad 27E and the drain pad 29E are allocated over the second region R2, respectively.

Further, a first gate electrode pad 12 is formed in the vicinity of the upper right corner of the first region R1 and a second gate electrode pad 13 is formed in the vicinity of the lower right corner of the second region R2, respectively.

Then a first metal plate wire 3E is electrically coupled over the drain pad 28E and a third metal plate wire 5E is electrically coupled over the source pad 27E, respectively.

A second metal plate wire 4E is electrically coupled over the source pad 26E and the drain pad 29E as a common metal plate.

Further, a part of the first metal plate wire 3E extending outward from above a semiconductor chip 2E is electrically coupled to an input terminal 6. A part of the second metal plate wire 4E extending outward from above the semiconductor chip 2E is also electrically coupled to an output terminal 7. A part of the third metal plate wire 5E extending outward from above the semiconductor chip 2E is also electrically coupled to a ground terminal 8. The input terminal 6, the output terminal 7, and the ground terminal 8 are located outside the semiconductor chip 2E.

Further, the first gate electrode pad 12 is coupled to a first gate terminal 9 located outside the semiconductor chip 2E through a bonding wire 14. The second gate electrode pad 13 is also coupled to a second gate terminal 10 located outside the semiconductor chip 2E through a bonding wire 15.

The semiconductor chip 2E is identical to the semiconductor chip 2 except that the shapes of the source pads 26E and 27E and the drain pads 28E and 29E are different.

In Embodiment 6, it is possible to obtain various effects such as the improvement of heat dissipation, the reduction of a parasitic resistance, the reduction of a wire inductance, the improvement of an electric power source efficiency, the reduction of a surge voltage, the inhibition of noises, etc. in the same way as Embodiment 1.

Although the invention established by the present inventors has heretofore been explained concretely on the basis of the embodiments, it goes without saying that the present invention is not limited to the embodiments and can be variously modified in the range not deviating from the tenor of the present invention.

For example, a semiconductor device may not be sealed with a resin but be sealed with another insulative material such as ceramics.

When source pads 26 and 27 and drain pads 28 and 29 include copper (Cu), solder bumps formed selectively over the pads: may be formed through an Ni—Au plated film selectively formed over copper (Cu); or may be formed over copper (Cu) pads in a non-plated state of not forming an Ni—Au plated film.

When copper wires or aluminum wires are used as bonding wires 14 and 15 coupled to a first gate terminal 9 and a second gate terminal 10, an insulation film may be applied or formed over the surface of a wire in order to prevent the wire from being oxidized.

What is claimed is:
1. A semiconductor device comprising:
a semiconductor chip comprising a principal surface and a plurality of MIS (Metal Insulator Semiconductor) type FETs (Field Effect Transistors) formed in said principal surface; and a plurality of metal plate wires, each of which has a pectinate shape, formed so as to cover said principal surface so that the pectinate parts are allocated alternately in a planar view, and said plural metal plate wires are electrically coupled to a plurality of terminals located outside said semiconductor chip, wherein said plural metal plate wires include a first metal plate wire, a second metal plate wire, and a third metal plate wire;

said plural terminals include an input terminal, an output terminal, and aground terminal;

said first metal plate wire is electrically coupled to said input terminal, said second metal plate wire is electrically coupled to said output terminal, and said third metal plate wire is electrically coupled to said ground terminal, respectively; and said input terminal, said output terminal, and said ground terminal are located outside said semiconductor chip, respectively.

2. The semiconductor device according to claim 1, wherein said semiconductor device further comprising source pads and drain pads of strip-shapes in a planar view, which are located under said pectinate first, second, and third metal plate wires over said principal surface of said semiconductor chip, extend in the direction crossing said first, second, and third metal plate wires, and are electrically coupled to said first, second, and third metal plate wires.

3. The semiconductor device according to claim 2, wherein said source pads and said drain pads are allocated alternately in a planar view over said principal surface of said semiconductor chip.

4. The semiconductor device according to claim 3, wherein said plural MIS type FETs include a first MIS type FET and a second MIS type FET;
said first MIS type FET is formed in a first region of said principal surface and said second MIS type FET is formed in a second region of said principal surface; and
said source pads and said drain pads are allocated over said first region of said principal surface and said second region different from said first region of said principal surface, respectively.

5. The semiconductor device according to claim 4, wherein said first and second MIS type FETs are horizontal MIS transistors;
said source pads and said drain pads located over said first region are electrically coupled to said first MIS type FET, respectively; and
said source pads and said drain pads located over said second region are electrically coupled to said second MIS type FET, respectively.

6. The semiconductor device according to claim 4, wherein a part of the pectinate shape of said second metal plate wire is commonly coupled to said source pads located over said first region and said drain pads located over said second region.

7. The semiconductor device according to claim 4, wherein said first metal plate wire is selectively coupled to said drain pads located over said first region through said pectinate shape.

8. The semiconductor device according to claim 4, wherein said third metal plate wire is selectively coupled to said source pads located over said second region through said pectinate shape.

9. The semiconductor device according to claim 4, wherein said source pads and said drain pads located over said first region and said source pads and said drain pads located over said second region extend in an identical direction, respectively; and said source pads over said first region and said drain pads over said second region are allocated so as to be located on identical lines.

10. The semiconductor device according to claim 4, wherein a first well region of a first conductivity type exists in said first region;

a second well region of the first conductivity type exists in said second region, respectively;

said first MIS type FET exists in said first well region; and said second MIS type FET exists in said second well region.

11. The semiconductor device according to claim 2, wherein said semiconductor device further comprises an encapsulation resin covering said semiconductor chip, said source pads, said drain pads, said first, second, and third metal plate wires, said input terminal, said output terminal, and said ground terminal; and respective parts of said input terminal, said output terminal, and said ground terminal are exposed from said encapsulation resin.

12. The semiconductor device according to claim 1, wherein said input terminal comprises a part of said first metal plate wire;

said output terminal comprises a part of said second metal plate wire; and said ground terminal comprises a part of said third metal plate wire.

13. The semiconductor device according to claim 1, wherein said semiconductor device further comprises a heat sink coupled to another principal surface on the other side of said principal surface of said semiconductor chip.

14. A semiconductor device comprising:

a semiconductor chip comprising a principal surface and a plurality of MIS (Metal Insulator Semiconductor) type FETs (Field Effect Transistors) formed in said principal surface;

a first metal plate wire that extends in a first direction over the principle surface of the semiconductor chip and beyond a first side of the semiconductor chip;

a second metal plate wire that extends in the first direction over the principle surface of the semiconductor chip and beyond a second side of the semiconductor chip, a third metal plate wire that extends in the first direction over the principle surface of the semiconductor chip and beyond the first side of the semiconductor chip; and a heat sink coupled to another principal surface of said principal surface of said semiconductor chip, wherein the first metal plate, the second metal plate, and the third metal plate overlap with each other in a second direction that is orthogonal to the first direction.

15. The semiconductor device according to claim 14, wherein the first metal plate wire is electrically coupled to a first terminal located outside of the semiconductor chip;

wherein the second metal plate wire is electrically coupled to a second terminal located outside of the semiconductor chip;

wherein the third metal plate wire is electrically coupled to a third terminal located outside of the semiconductor chip;

wherein said semiconductor device further comprises an encapsulation resin covering at least said semiconductor chip, portions of said first, second and third metal plate wires, and portions of said heat sink; and said first, second and third terminals and said heat sink are exposed selectively from said encapsulation resin.

16. The semiconductor device according to claim 14, wherein said semiconductor device further comprises source pads and drain pads between said first, second and third metal plate wires and said semiconductor chip.

17. The semiconductor device according to claim 16, wherein said source pads and said drain pads are allocated alternately over said principal surface of said semiconductor chip.

18. The semiconductor device according to claim 16, wherein said source pads and said drain pads extend in the second direction.

* * * * *